(12) United States Patent
Suzuki et al.

(10) Patent No.: US 7,638,888 B2
(45) Date of Patent: Dec. 29, 2009

(54) SEMICONDUCTOR CHIP MOUNTING SUBSTRATE, SEMICONDUCTOR CHIP MOUNTING BODY, SEMICONDUCTOR CHIP STACKED MODULE, AND SEMICONDUCTOR CHIP MOUNTING SUBSTRATE MANUFACTURING METHOD

(75) Inventors: Naoki Suzuki, Osaka (JP); Akihisa Nakahashi, Osaka (JP); Yukihiro Maegawa, Osaka (JP)

(73) Assignee: Panasonic Corporation, Osaka (JP)

( * ) Notice: Subject to any disclaimer, the term of this patent is extended or adjusted under 35 U.S.C. 154(b) by 176 days.

(21) Appl. No.: 12/031,363

(22) Filed: Feb. 14, 2008

(65) Prior Publication Data
US 2008/0197471 A1    Aug. 21, 2008

(30) Foreign Application Priority Data

Feb. 16, 2007  (JP) ............................ 2007-037190
Feb. 1, 2008  (JP) ............................ 2008-023325

(51) Int. Cl.
H01L 23/544    (2006.01)
(52) U.S. Cl. ........................... 257/797; 438/401
(58) Field of Classification Search .......... 257/797, 257/686, 777; 438/401, 462
See application file for complete search history.

(56) References Cited

U.S. PATENT DOCUMENTS

| | | | | | |
|---|---|---|---|---|---|
| 5,986,338 | A | * | 11/1999 | Nakajima | 257/700 |
| 2005/0051909 | A1 | * | 3/2005 | Inomata | 257/797 |
| 2005/0110785 | A1 | * | 5/2005 | Ochiai et al. | 345/206 |
| 2008/0284048 | A1 | * | 11/2008 | Kim et al. | 257/797 |

FOREIGN PATENT DOCUMENTS

| | | | |
|---|---|---|---|
| JP | 63-201373 | U | 12/1988 |
| JP | 7-179088 | A | 7/1995 |
| JP | 9-186413 | A | 7/1997 |
| JP | 10-223999 | A | 8/1998 |
| JP | 2001-7460 | A | 1/2001 |
| WO | WO 2006/095703 | A1 | 9/2006 |

* cited by examiner

Primary Examiner—S. V Clark
(74) Attorney, Agent, or Firm—RatnerPrestia

(57) ABSTRACT

There is provided a semiconductor chip mounting substrate including a substrate on which a mounting region for mounting a semiconductor chip and a connection region for interlayer connection of the semiconductor chip are formed, and a plurality of alignment marks for alignment at the time of stacking which are provided around or in the connection region on the substrate, wherein a reinforcing member as a reinforcing region for reinforcing a portion between the plurality of alignment marks is provided on the substrate.

21 Claims, 25 Drawing Sheets

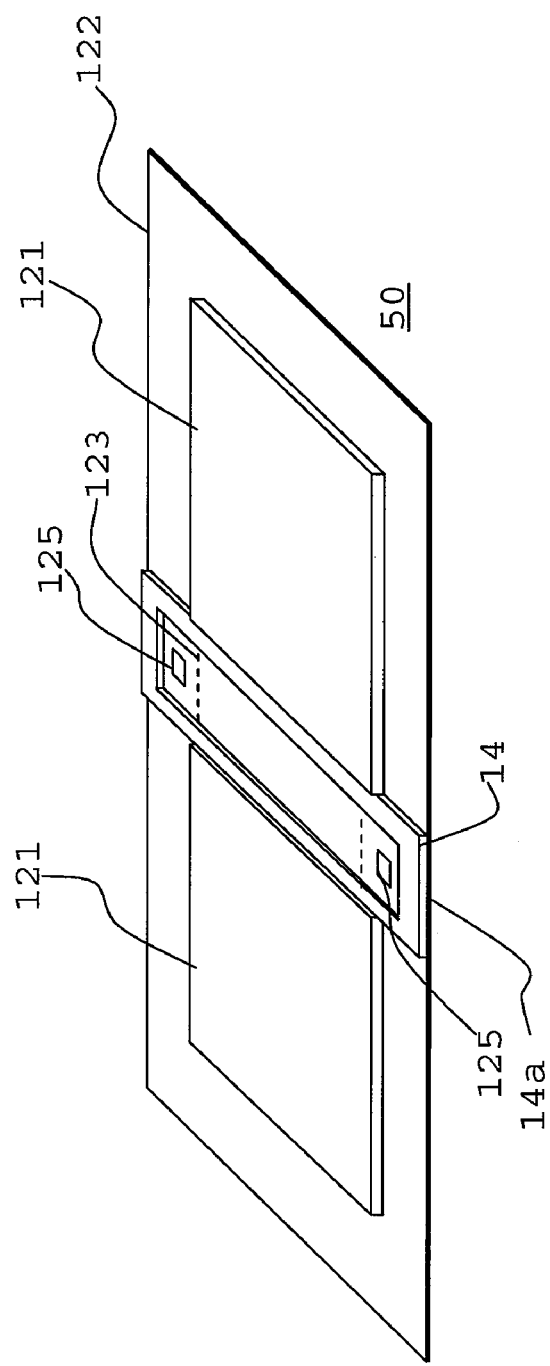

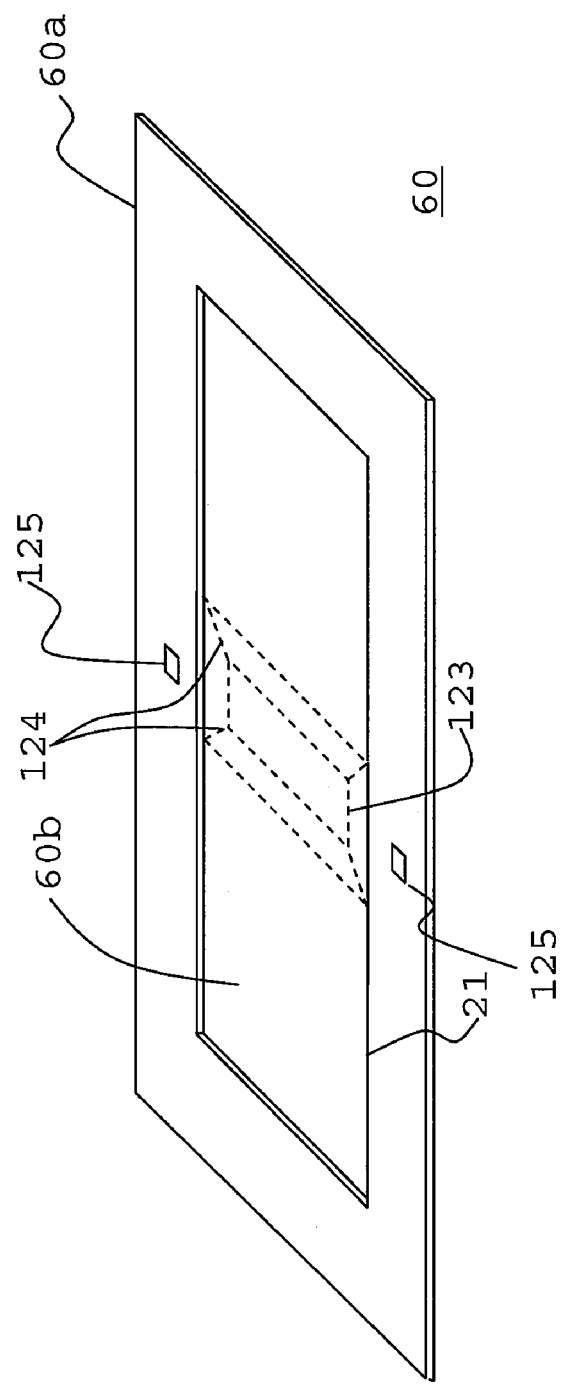
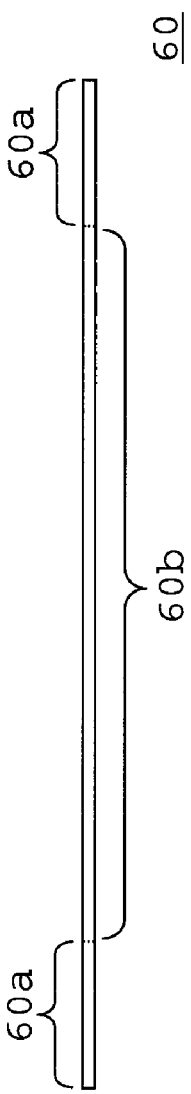
FIG. 7 (A)
FIG. 7 (B)

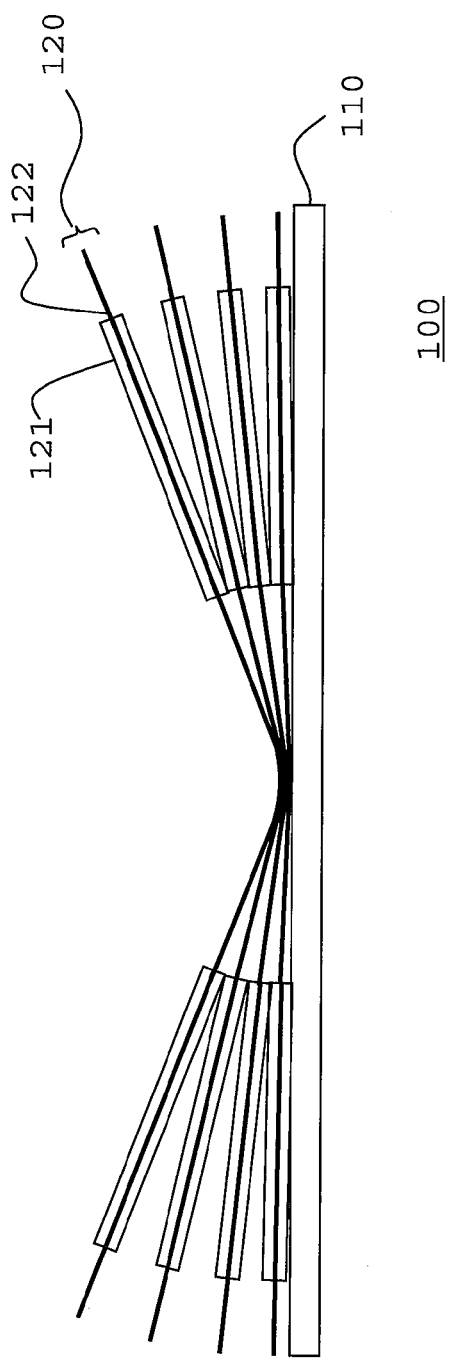
FIG. 24 (A) PRIOR ART
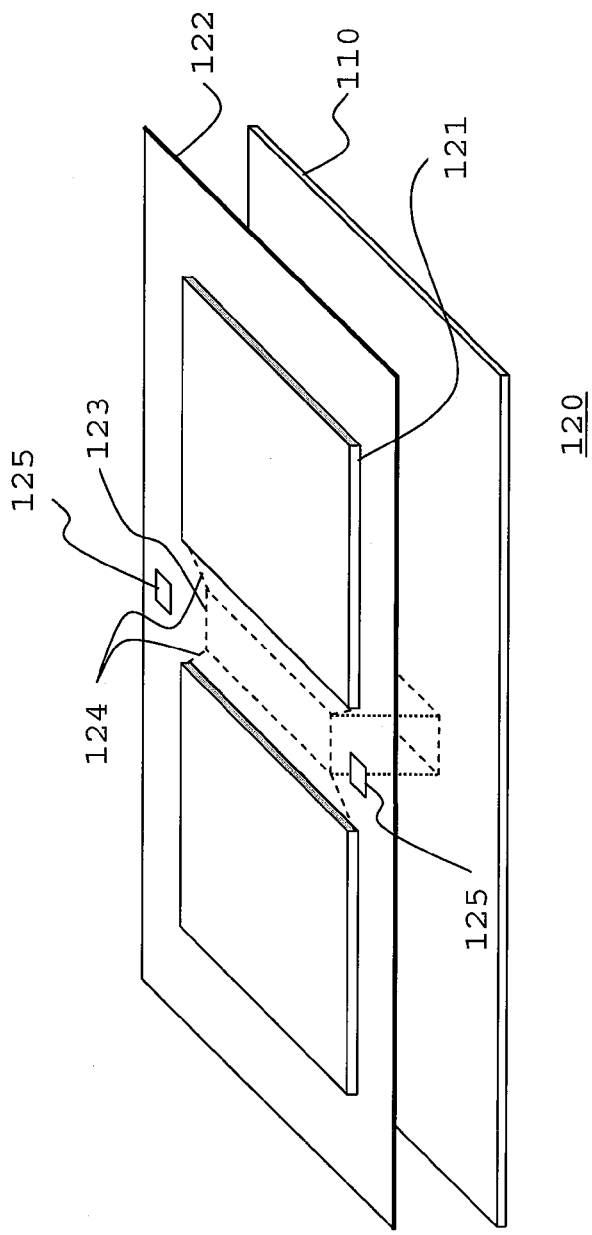
FIG. 24 (B) PRIOR ART

SEMICONDUCTOR CHIP MOUNTING SUBSTRATE, SEMICONDUCTOR CHIP MOUNTING BODY, SEMICONDUCTOR CHIP STACKED MODULE, AND SEMICONDUCTOR CHIP MOUNTING SUBSTRATE MANUFACTURING METHOD

BACKGROUND OF THE INVENTION

1. Field of the Invention

The present invention relates to a semiconductor chip mounting substrate, a semiconductor chip mounting body, a semiconductor chip stacked module, and a semiconductor chip mounting substrate manufacturing method.

2. Related Art of the Invention

There has been growing demand for size reduction, thickness reduction, and integration degree increase in various semiconductor chips used in an electronic device along with size reduction, performance increase, and density increase in electronic devices.

High-density packaging technologies as typified by MCM, MCP, and the like are also introduced into the fields of memory, PC Card, and the like. An example of the introduction is known as a semiconductor chip stacked module in which semiconductor chips as bare chips are stacked on a mother board (see, e.g., International Publication WO 2006/095703).

A conventional semiconductor stacked module will be described below.

FIG. 24(A) is a side view showing a configuration of a semiconductor stacked module, and FIG. 24(B) is an exploded perspective view schematically showing the structure of the semiconductor stacked module.

As shown in FIG. 24(A), a semiconductor stacked module 100 is formed by stacking a plurality of semiconductor chip mounting bodies 120, each having semiconductor chips 121 mounted on each surface of a substrate 122, on a mother board 110 for external connection.

As shown in FIG. 24(B), in each semiconductor chip mounting body 120, the semiconductor chips 121 are provided in a pair on the substrate 122. The substrate 122 has a configuration in which electrodes are inserted in a film of resin such as polyimide. Electric wires of each semiconductor chip 121 are led out from a bonding surface between the semiconductor chip 121 and the substrate 122 as wiring patterns, and the wiring patterns are formed as a circuit electrode 124 in the substrate.

A connection region 123 is further formed between the circuit electrodes 124. The connection region 123 is a region where electrodes led from the circuit electrodes 124, through holes, or the like are formed. These portions are exposed to the outside. Note that the surface of the substrate 122 including the surfaces of the circuit electrodes 124 is covered with an insulating film, and each semiconductor chip mounting body 120 does not electrically connect with the other semiconductor chip mounting bodies 120 at a portion other than the connection region 123.

A pair of alignment marks 125 is provided on the substrate 122. The alignment marks 125 are used to align the connection regions 123 at the time of stacking of the semiconductor chip mounting bodies 120. The alignment marks 125 are formed on the substrate 122 by patterning such as etching or plating simultaneously with formation of the circuit electrodes 124 and the electrodes in the film in the connection region 123.

The plurality of semiconductor chip mounting bodies 120 as described above are fabricated and are sequentially stacked while checking the positions of the alignment marks 125 using a recognizer and automatically aligning the semiconductor chip mounting body 120. The connection regions 123 are brought into pressure contact with one another, and the electrodes or through holes in the connection regions 123 are electrically connected in a thickness direction.

With this process, the semiconductor chip mounting bodies 120 at respective layers are connected, and one stacked module is finished. In the example shown in FIG. 24(A), the semiconductor chip mounting bodies 120 are configured to have the same dimensions. Due to the thicknesses of the semiconductor chips 121, when the semiconductor chip mounting bodies 120 are stacked, one located higher is more inclined. In an actual example, the semiconductor chip mounting bodies 120 are designed in consideration of the thicknesses of the semiconductor chips 121 such that one located higher has the circuit electrodes 124 with larger widths and a wider interval between the pair of semiconductor chips 121. With this configuration, in the stacked module, the semiconductor chip mounting bodies 120 are stacked such that the surfaces of each of the semiconductor chips 121 facing each other are in pressure contact with each other, as shown in FIG. 25.

A wholly dense semiconductor memory can be obtained by using, e.g., a RAM as the semiconductor chip 121 in a semiconductor stacked module as described above. For example, the capacity of an SD Memory Card can be increased.

Size reduction and thickness reduction in the semiconductor chip mounting bodies 120 constituting a semiconductor stacked module are required for size reduction and density increase in modules.

Especially if a ready-made product with predetermined specs and dimensions (e.g., with a uniform thickness of 50 μm) is used as the semiconductor chip 121, thinning of the substrate 122 is effective in thinning a module. Currently available substrates are 30 to 50 μm in thickness. Size reduction and density increase in a semiconductor stacked module are expected to be achieved by thinning the substrate 122 to less than the range.

However, use of a substrate thinner than ever before in a semiconductor stacked module suffers the problem below.

In the fabrication of the semiconductor chip mounting body 120, mounting of the semiconductor chips 121 on the substrate 122 is performed by flip-chip mounting.

If a base material thinner than a currently used one is used for the substrate 122 at this time, the substrate 122 may expand or deform due to heat treatment. Since the circuit electrodes 124 and the electrodes in the connection region 123, which are electrodes formed in the film of the substrate 122, are configured to have a large area at the substrate surface, they are not affected by the heat treatment. In contrast, since the alignment marks 125 are small structures independent of the circuit electrodes 124 and other portions, they are positionally shifted from the initial positions at the time of formation due to the deformation in the substrate 122.

If the alignment marks 125 are positionally shifted, the connection regions 123 cannot be aligned with one another at the time of stacking of the semiconductor chip mounting bodies 120.

As described above, ensuring of alignment of the semiconductor chip mounting bodies 120 to be stacked has become an issue for size reduction and density increase in a semiconductor stacked module.

SUMMARY OF THE INVENTION

The present invention has been made in consideration of the issue, and its object is to provide a semiconductor chip mounting substrate and the like capable of ensuring alignment at the time of stacking while thinning a semiconductor chip mounting body.

The 1$^{st}$ aspect of the present invention is a semiconductor chip mounting substrate comprising:

a substrate on which a mounting region for mounting a semiconductor chip and a connection region for interlayer connection of the semiconductor chip are formed; and a plurality of alignment marks for alignment at the time of stacking which are provided around or in the connection region on the substrate, wherein a reinforcing region for reinforcing a portion between the plurality of alignment marks is formed on the substrate.

The 2$^{nd}$ aspect of the present invention is the semiconductor chip mounting substrate according to the 1$^{st}$ aspect of the present invention, wherein at least a pair of ones of the plurality of alignment marks are provided in such a way as sandwich to have the connection region between the pair of alignment marks.

The 3$^{rd}$ aspect of the present invention is the semiconductor chip mounting substrate according to the 1$^{st}$ aspect of the present invention, wherein the alignment marks are arranged in the reinforcing region.

The 4$^{th}$ aspect of the present invention is the semiconductor chip mounting substrate according to the 3$^{rd}$ aspect of the present invention, wherein the reinforcing region is formed to overlap with the connection region.

The 5$^{th}$ aspect of the present invention is the semiconductor chip mounting substrate according to the 1$^{st}$ aspect of the present invention, wherein the mounting region and connection region are adjacent to each other and the reinforcing region is formed to surround the mounting region and connection region.

The 6$^{th}$ aspect of the present invention is the semiconductor chip mounting substrate according to the 1$^{st}$ aspect of the present invention, wherein the mounting region and connection region are adjacent to each other, and the reinforcing region is formed to surround only the connection region.

The 7$^{th}$ aspect of the present invention is the semiconductor chip mounting substrate according to the 1$^{st}$ aspect of the present invention, wherein the mounting region comprises a pair of regions which sandwich the connection region between the pair of regions.

The 8$^{th}$ aspect of the present invention is the semiconductor chip mounting substrate according to the 1$^{st}$ aspect of the present invention, wherein a thickness of the reinforcing region of the substrate is larger than a thickness of the remaining region of the substrate.

The 9$^{th}$ aspect of the present invention is the semiconductor chip mounting substrate according to the 8$^{th}$ aspect of the present invention, wherein the substrate is a body formed by stacking a base material with a predetermined shape which includes the mounting region, connection region, and reinforcing region and a reinforcing member with a shape corresponding to the reinforcing region.

The 10$^{th}$ aspect of the present invention is the semiconductor chip mounting substrate according to the 8$^{th}$ aspect of the present invention, wherein the substrate is composed of a single member in which a thickness of a portion corresponding to the reinforcing region is larger than a thickness of the remaining portion.

The 11$^{th}$ aspect of the present invention is the semiconductor chip mounting substrate according to the 8$^{th}$ aspect of the present invention, wherein the thickness of the reinforcing region is smaller than a thickness of the semiconductor chip.

The 12$^{th}$ aspect of the present invention is the semiconductor chip mounting substrate according to the 8$^{th}$ aspect of the present invention, wherein the thickness of the reinforcing region is equal to a thickness of the semiconductor chip.

The 13$^{th}$ aspect of the present invention is the semiconductor chip mounting substrate according to the 1$^{st}$ aspect of the present invention, wherein a thickness of the reinforcing region of the substrate is equal to thicknesses of portions where the alignment marks are provided.

The 14$^{th}$ aspect of the present invention is the semiconductor chip mounting substrate according to the 13$^{th}$ aspect of the present invention, further comprising a reinforcing pattern provided in the reinforcing region on the substrate which has a thickness equal to thicknesses of the alignment marks.

The 15$^{th}$ aspect of the present invention is the semiconductor chip mounting substrate according to the 14$^{th}$ aspect of the present invention, wherein the reinforcing pattern is made of a same material as a material for the alignment marks.

The 16$^{th}$ aspect of the present invention is the semiconductor chip mounting substrate according to the 14$^{th}$ aspect of the present invention, wherein the reinforcing pattern doubles as a wiring pattern which electrically connects the mounting region and connection region.

The 17$^{th}$ aspect of the present invention is a semiconductor chip mounting body comprising:

a semiconductor chip mounting substrate according to the 1$^{st}$ aspect of the present invention; and a semiconductor chip mounted in the mounting region of the mounting substrate.

The 18$^{th}$ aspect of the present invention is a semiconductor chip stacked module, wherein a plurality of semiconductor chip mounting bodies according to the 17$^{th}$ aspect of the present invention are stacked by alignment based on the alignment marks, and the semiconductor chip mounting bodies are electrically connected to each other at the connection regions.

The 19$^{th}$ aspect of the present invention is the semiconductor chip stacked module according to the 18$^{th}$ aspect of the present invention, wherein the plurality of semiconductor chip mounting bodies are stacked while every adjacent reinforcing regions of the semiconductor chip mounting substrates are in contact with each other, and every adjacent surfaces of the semiconductor chips are in contact with each other.

The 20$^{th}$ aspect of the present invention is a semiconductor chip mounting substrate manufacturing method comprising:

a step of bonding, to a base material with a predetermined shape on which a mounting region for mounting a semiconductor chip and a connection region for interlayer connection of the semiconductor chip are formed, a reinforcing member which is either formed around the connection region or formed to overlap with the connection region, wherein a plurality of alignment marks for alignment at the time of stacking are provided in one of the reinforcing member and the connection region.

The 21$^{st}$ aspect of the present invention is a semiconductor chip mounting substrate manufacturing method comprising:

a step of providing, on a base material with a predetermined shape on which a mounting region for mounting a semiconductor chip and a connection region for interlayer connection of the semiconductor chip are formed, a plurality of alignment marks for alignment at the time of stacking; and a step of forming a reinforcing pattern with a thickness equal to thicknesses of the plurality of alignment marks for reinforcing a portion between the alignment marks, which is to be performed at the time before or after or at the same time, as the step of providing the alignment marks.

According to the present invention, it is possible to provide a semiconductor chip mounting substrate and the like capable of ensuring alignment at the time of stacking while thinning a semiconductor chip mounting body.

BRIEF DESCRIPTION OF THE DRAWINGS

FIG. 6(A) is a perspective view showing a second configuration of the semiconductor chip mounting body according to the third embodiment of the present invention, and FIG. 6(B) is a perspective view showing the other configuration of the semiconductor chip mounting body according to the third embodiment of the present invention;

FIG. 7(A) is a perspective view showing the other configuration of the semiconductor chip mounting body according to the third embodiment of the present invention, and FIG. 7(B) is a side view showing the other configuration of the semiconductor chip mounting body according to the third embodiment of the present invention;

FIG. 24(A) is a side view showing a configuration of a semiconductor chip stacked module according to a conventional technique, and FIG. 24(B) is an exploded perspective view showing a configuration of a semiconductor chip mounting body according to the conventional technique.

DESCRIPTION OF SYMBOLS

Figure 1A:
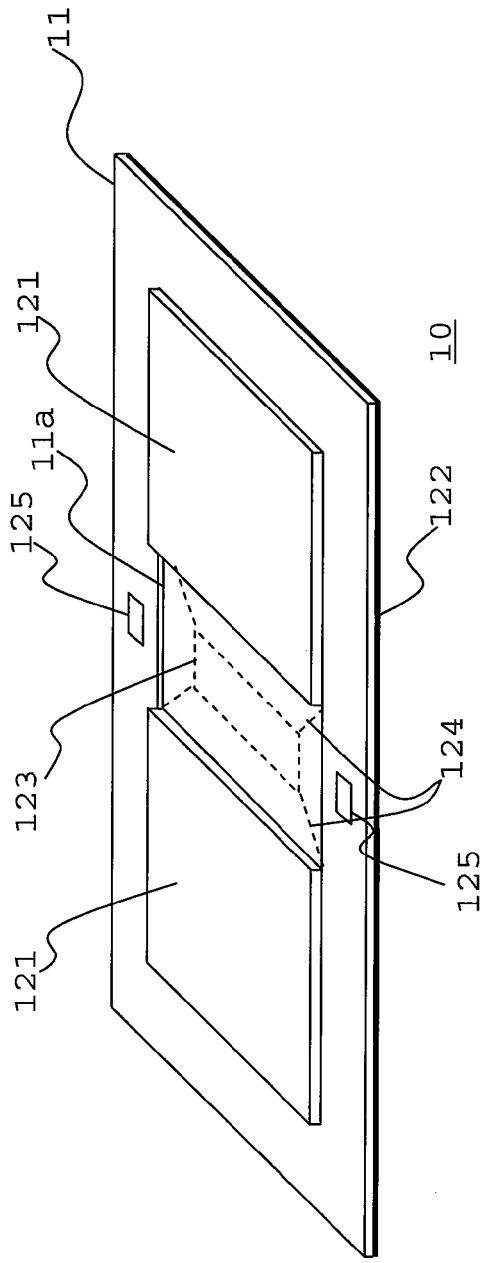
FIG. 1(A) is a perspective view showing a configuration of a semiconductor chip mounting body according to a first embodiment of the present invention.

10 semiconductor chip mounting body
11 reinforcing member
11a opening
20 semiconductor chip mounting substrate
21 mounting region
121 semiconductor chip
122 substrate
123 connection region
124 circuit electrode
125 alignment mark

PREFERRED EMBODIMENTS OF THE INVENTION

Embodiments of the present invention will be described below with reference to the drawings.

First Embodiment

A semiconductor chip mounting body according to a first embodiment is characterized by a semiconductor chip mounting substrate on which a semiconductor chip is mounted.

Figure 1B:
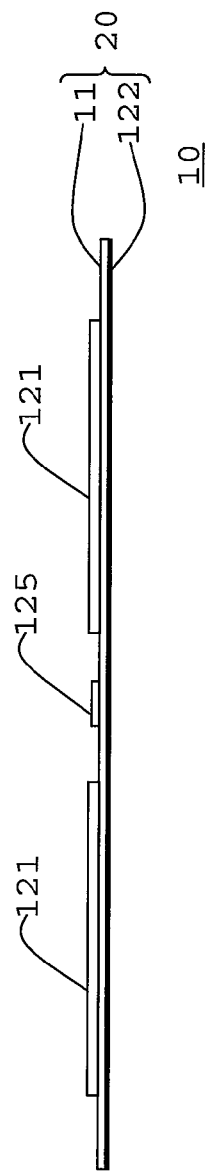
FIG. 1(B) is a side view showing the configuration of the semiconductor chip mounting body according to the first embodiment of the present invention.

FIG. 1(A) is a perspective view schematically showing a configuration of a semiconductor chip mounting body according to the first embodiment of the present invention, and FIG. 1(B) is a side view thereof. Note that portions same as or corresponding to those in FIG. 24(A) are denoted by the same reference numerals.

As shown in FIG. 1(A), a semiconductor chip mounting body 10 of this embodiment includes a frame-like reinforcing member 11. The reinforcing member 11 is provided along the edges of the semiconductor chip mounting body 10, and a connection region 123 and a pair of semiconductor chips 121 are arranged inside of an opening 11a. The reinforcing member 11 is made of, e.g., polyimide and has a thickness smaller than those of the semiconductor chips 121.

As shown in FIG. 1(B), the reinforcing member 11 is stacked on a substrate 122 and, together with the substrate 122, constitutes a semiconductor chip mounting substrate.

Figure 2:
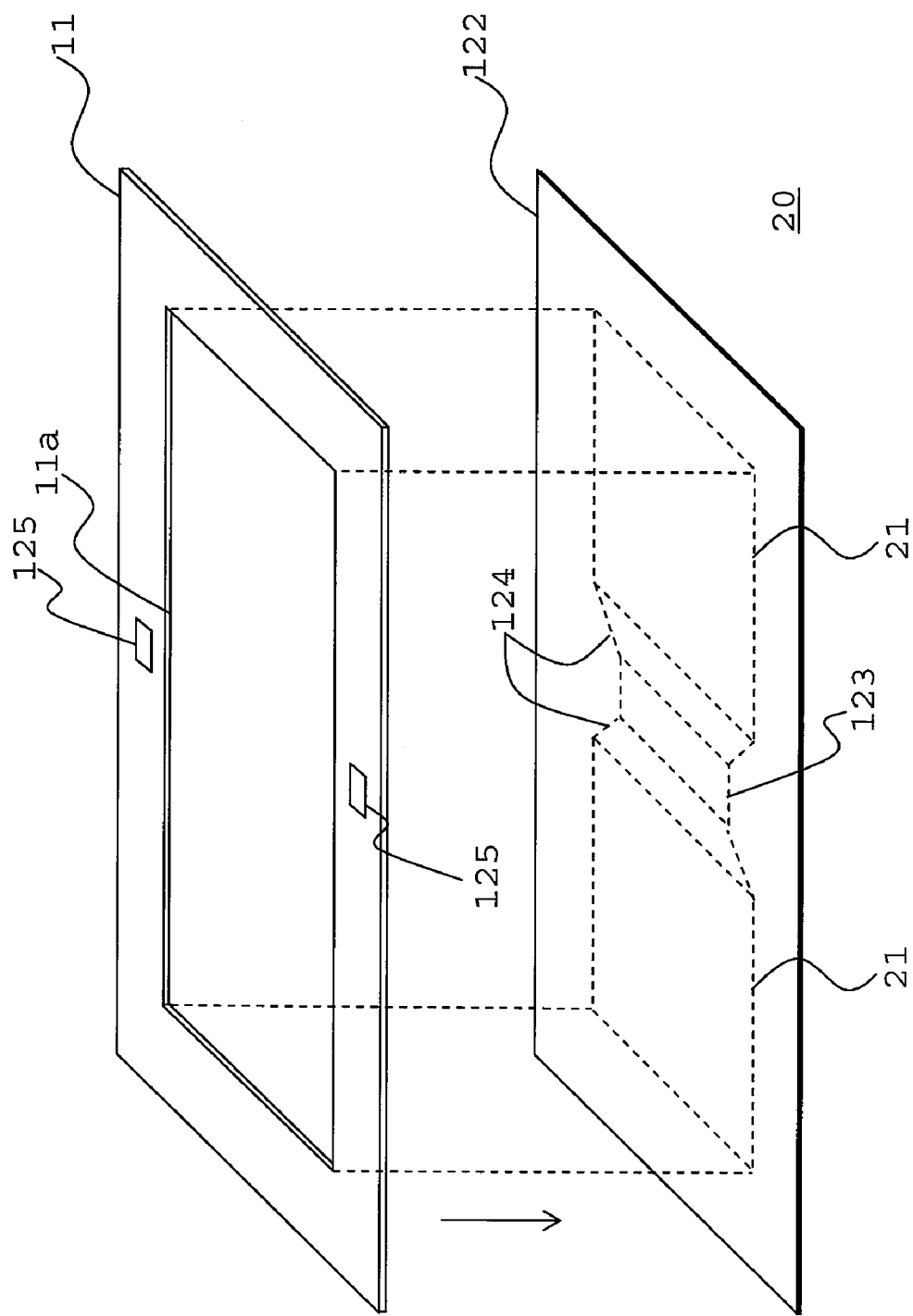
FIG. 2 is an exploded perspective view showing the configuration of the semiconductor chip mounting substrate according to the first embodiment of the present invention.

FIG. 2 shows an exploded perspective view of a semiconductor chip mounting substrate 20 constituting a part of the semiconductor chip mounting body 10 of this embodiment. Note that portions same as or corresponding to those in FIG. 1(A) are denoted by the same reference numerals, and a detailed description thereof will be omitted.

The semiconductor chip mounting substrate 20 is a substrate at a stage before the semiconductor chips 121 are mounted and has mounting regions 21 in which the semiconductor chips 121 are to be mounted in addition to the connection region 123. The reinforcing member 11 has an external shape which coincides with that of the substrate 122 and has a frame-like shape to surround the mounting regions 21 and connection region 123. The semiconductor chip mounting substrate 20 is formed as a stacked substrate by bonding together the reinforcing member 11 and substrate 122.

A pair of rectangular alignment marks 125 is formed on the reinforcing member 11 by etching or plating, like the conventional example.

Note that in the above-described configuration, the semiconductor chip mounting body 10 corresponds to a semiconductor chip mounting body according to the present invention, and the semiconductor chip mounting substrate 20 corresponds to a semiconductor chip mounting substrate according to the present invention. Also note that each mounting region 21 corresponds to a mounting region according to the present invention, and the connection region 123 corresponds to a connection region according to the present invention.

Further note that the substrate 122 corresponds to a base material according to the present invention, the reinforcing member 11 corresponds to a reinforcing member according to the present invention, and each alignment mark 125 corresponds to a alignment mark according to the present invention.

The semiconductor chip mounting body 10 of this embodiment with the above-described configuration is characterized in that the semiconductor chip mounting substrate 20 having the frame-like reinforcing member 11 bonded thereto is used, and the alignment marks 125 are formed on the reinforcing member 11.

In the semiconductor chip mounting substrate 20, since a stacked portion of the reinforcing member 11 and substrate 122 is reinforced by the reinforcing member 11 and has strength enough to keep from deforming due to heat treatment at the time of mounting of the semiconductor chips 121. Accordingly, the alignment marks 125 formed at the stacked portion are not positionally shifted.

The reinforcing member 11 is thinner than the semiconductor chips 121. The thickness of the semiconductor chip mounting body 10 is determined by those of the semiconductor chips 121 and substrate 122 and, accordingly, depends on the thickness of the substrate 122. The reinforcement with the reinforcing member 11 allows use of a thin film with a thickness of 10 to 15 μm as the substrate 122.

As described above, according to this embodiment, it is possible to prevent the alignment marks 125 from being positionally shifted at the time of mounting of the semiconductor chips 121 and achieve thickness reduction in a semiconductor chip mounting body.

Figure 3:
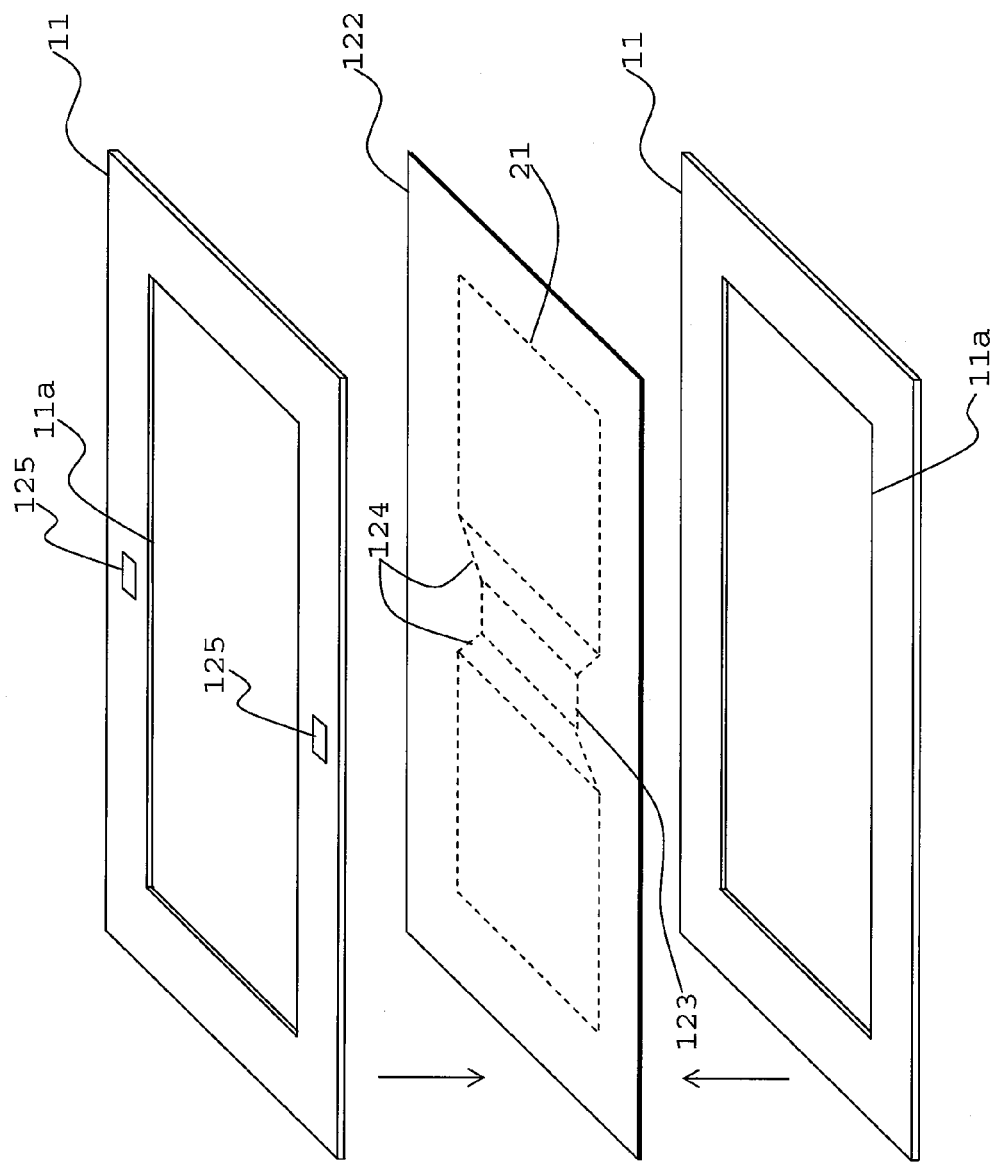
FIG. 3 is an exploded perspective view showing the other configuration of the semiconductor chip mounting substrate according to the first embodiment of the present invention.

Note that although the semiconductor chip mounting substrate 20 has a stacked structure formed by bonding the reinforcing member 11 to one of the two surfaces of the substrate 122 in the configuration shown in FIG. 2, it may have a stacked structure formed by respectively bonding the reinforcing members 11 with the same dimensions to the two surfaces, as shown in FIG. 3. In this case, the alignment marks 125 are formed on each of the surfaces of the reinforcing members 11 on the upper and lower sides. Note that if the reinforcing member 11 is permeable, the alignment marks 125 may be provided on either one of the upper and lower reinforcing members 11.

Figure 1C:
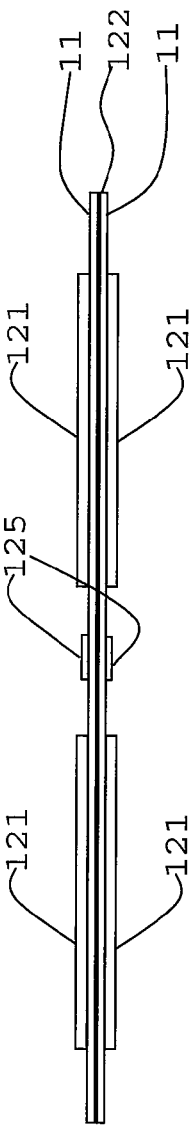
FIG. 1(C) is a side view showing the other configuration of the semiconductor chip mounting body according to the first embodiment of the present invention.

Use of such a semiconductor chip mounting substrate allows mounting of the semiconductor chips 121 on each surface of the substrate, as shown in FIG. 1(C), and allows reduction in the thickness of a high-density semiconductor chip mounting body.

The thickness of the reinforcing member 11 is set to be smaller than those of the semiconductor chips 121. This is because the setting improves heat dissipation among semiconductor chip mounting bodies in a semiconductor chip stacked module. However, the thickness may be set to be equal. This is because the thicknesses of the semiconductor chips 121 can be maximized as long as the thickness of the semiconductor chip mounting body 10 depends on the thicknesses of the semiconductor chips 121.

Second Embodiment

A semiconductor chip mounting body and a semiconductor chip mounting substrate according to a second embodiment are characterized in that alignment marks are provided on a substrate edged with a frame-like reinforcing member. The second embodiment will be described below.

Figure 4:
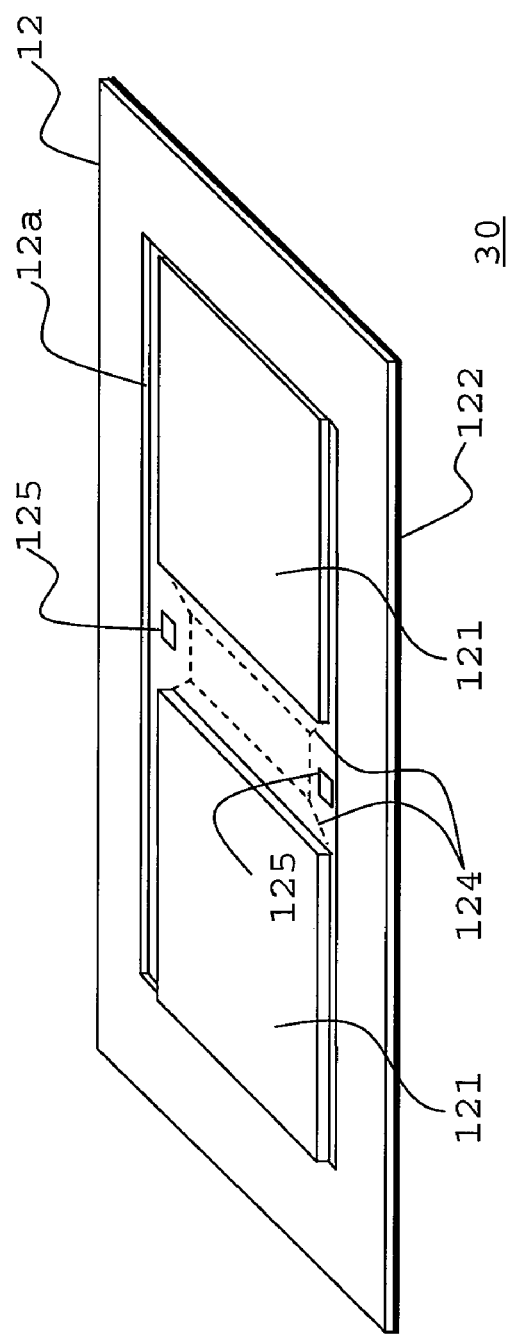
FIG. 4(A) is a perspective view showing a configuration of a semiconductor chip mounting body according to a second embodiment of the present invention.
FIG. 4(B) is a side view showing the configuration of the semiconductor chip mounting body according to the second embodiment of the present invention.
Figure 4:
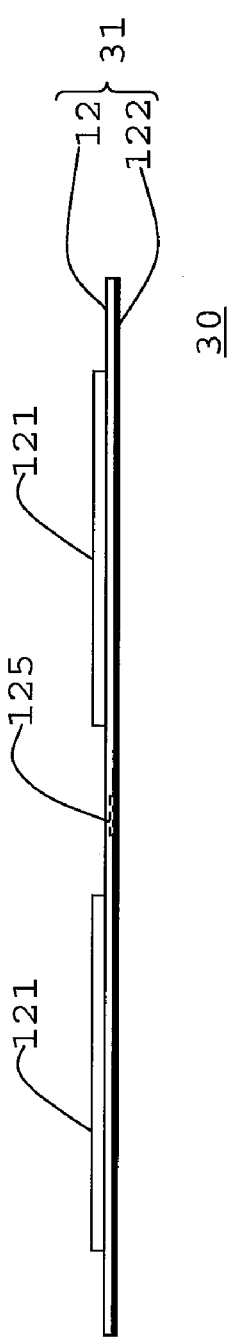

FIG. 4(A) is a perspective view schematically showing a configuration of the semiconductor chip mounting body according to the second embodiment, and FIG. 4(B) is a side view. Note that portions same as or corresponding to those in FIG. 1(A) are denoted by the same reference numerals.

As shown in FIG. 4(A), a semiconductor chip mounting body 30 of this embodiment is formed by using a semiconductor chip mounting substrate 31 having a frame-like reinforcing member 12. The semiconductor chip mounting substrate 31 is characterized in that the reinforcing member 12 has an opening 12a which is expanded both on the upper and lower edges sides of the semiconductor chips 121, as compared to the opening 11a of the reinforcing member 11 in the first embodiment, and alignment marks 125 are directly formed on a substrate 122 inside the frame-like shape, as shown in FIG. 4(B). Other configurations and dimensions are the same as those in the first embodiment.

In the above-described configuration, the reinforcing member 12 corresponds to a reinforcing member according to the present invention.

In the semiconductor chip mounting body 30 of this embodiment with the above-described configuration, a stacked portion of the reinforcing member 12 and substrate 122 of the semiconductor chip mounting substrate 31 is formed to seamlessly surround regions (not shown, same as the mounting regions 21 in FIG. 2) where the semiconductor chips 121 are mounted and a connection region 123.

Since the strength of the periphery of a principal surface of the substrate 122 including the mounting regions and connection region 123 is increased by the stacked portion, the principal surface of the substrate 122 has strength enough to keep from deforming due to heat treatment at the time of mounting of the semiconductor chips 121. Accordingly, even if the alignment marks 125 are directly formed on the substrate 122, they are not positionally shifted.

As described above, according to this embodiment, it is possible to prevent the alignment marks 125 from being positionally shifted at the time of mounting of the semiconductor chips 121 and achieve thickness reduction in a semiconductor chip mounting body even if the alignment marks 125 are directly formed on the substrate 122.

Note that although in the above explanation, the opening 12a has been described as being expanded on the upper and lower edges sides of the semiconductor chips 121 in FIG. 4(A), the opening 12a may be set to be located at an arbitrary position and have an arbitrary size as long as space for the alignment marks 125 can be made on the substrate 122. This embodiment is not limited to any specific shape or arrangement as long as regions of the substrate 122 where the alignment marks 125 are arranged are seamlessly surrounded by the stacked portion of the reinforcing member 12 and substrate 122.

As in the configuration shown in FIG. 3, the reinforcing member 12 may be provided on each surface of the substrate 122.

Third Embodiment

A semiconductor chip mounting body and a semiconductor chip mounting substrate according to a third embodiment are characterized in that a frame-like reinforcing member is shaped to surround a connection region. The third embodiment will be described.

Figure 5A:
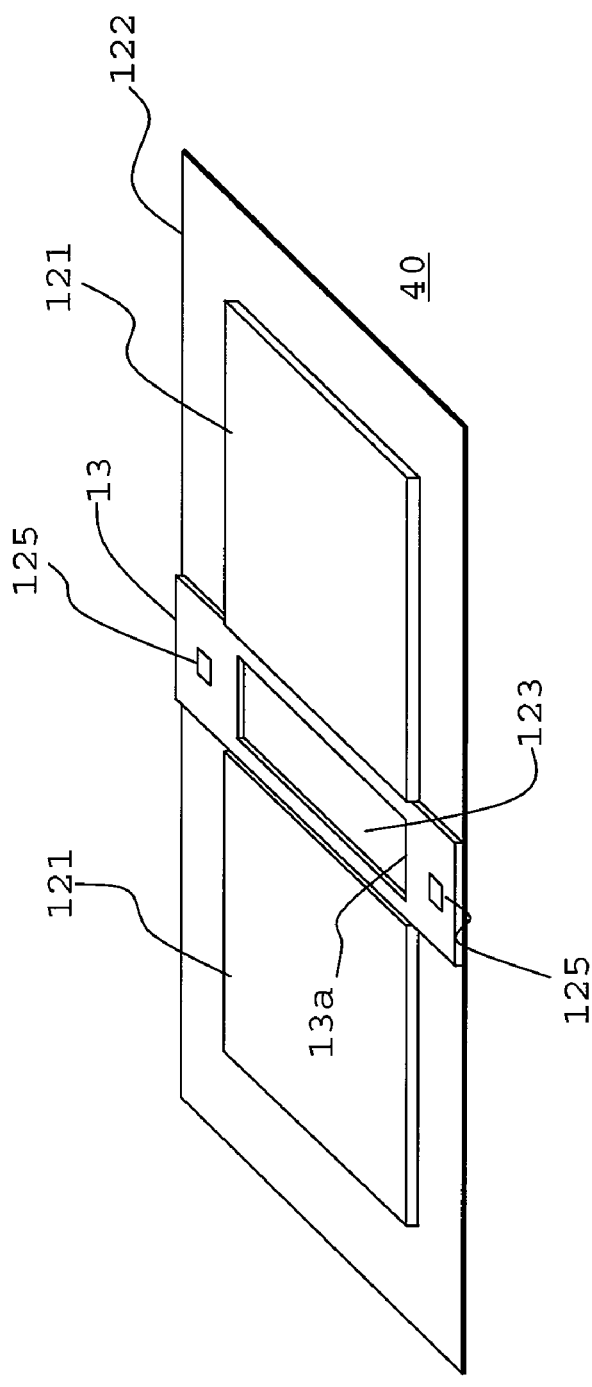
FIG. 5(A) is a perspective view showing a configuration of a semiconductor chip mounting body according to a third embodiment of the present invention.
Figure 5B:
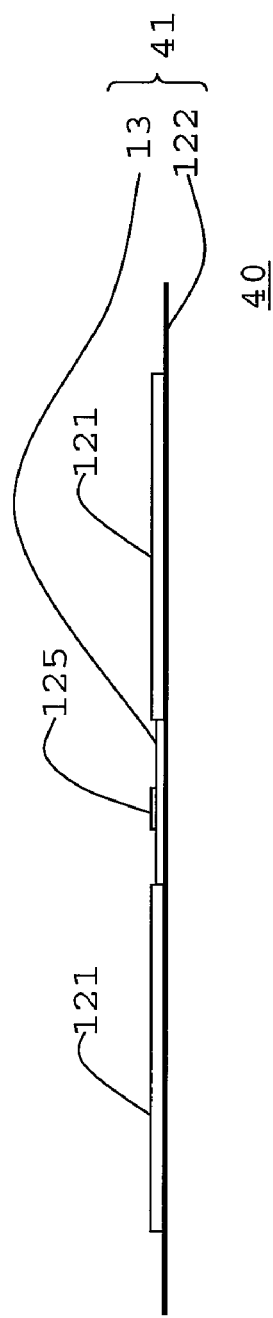
FIG. 5(B) is a side view showing the configuration of the semiconductor chip mounting body according to the third embodiment of the present invention.

FIG. 5(A) is a perspective view schematically showing a configuration of a semiconductor chip mounting body according to the third embodiment of the present invention, and FIG. 5(B) is a side view. Portions same as or corresponding to those in FIGS. 1(A) to 1(C) and 2 are denoted by the same reference numerals, and a detailed description thereof will be omitted.

As shown in FIGS. 5(A) and 5(B), a semiconductor chip mounting body 40 of this embodiment is formed by using a semiconductor chip mounting substrate 41 having a frame-like reinforcing member 13. The semiconductor chip mounting substrate 41 is characterized in that the reinforcing member 13 is provided between a pair of semiconductor chips 121 and has an opening 13a with an external shape which coincides with that of a connection region 123, and alignment marks 125 are formed on the reinforcing member 13. The thickness of the reinforcing member 13 is equal to those of the reinforcing members 11 and 12 in the first and second embodiments.

In the semiconductor chip mounting body 40 of this embodiment with the above-described configuration, a stacked portion of the reinforcing member 13 and a substrate 122 of the semiconductor chip mounting substrate 41 is formed to seamlessly surround only the connection region 123. Accordingly, the reinforcing member 13 does not cover regions where mounting regions 21 and the edges of the substrate 122 are opposed to each other.

In a semiconductor chip stacked module, alignment is required in stacking of semiconductor chip mounting bodies to achieve interlayer connection of electrodes, through holes, or the like formed in connection regions of the semiconductor chip mounting bodies. Accordingly, only the minimum region necessary to prevent the alignment marks 125 from being positionally shifted needs to be reinforced in the thin substrate 122. More specifically, the substrate 122 only needs to be reinforced to a level enough to prevent the positions of the pair of alignment marks 125 from being changed.

As shown in FIG. 2, in the thin substrate 122, each of the pair of mounting regions 21 is arranged apart from the connection region 123 with a circuit electrode 124 on the substrate 122 there between.

Accordingly, reinforcement of regions between the mounting regions 21 and the connection region 123 makes it possible to adequately prevent the alignment marks 125 from being positionally shifted.

Unlike the first and second embodiments, since the semiconductor chips 121's surroundings are not reinforced, they may expand or deform due to heat treatment. However, in a semiconductor chip stacked module, high alignment accuracy is required only in the vicinity of connection regions requiring interlayer connection in stacking of semiconductor chip mounting bodies. A positional shift of each semiconductor chip 121 itself does not affect the stacked state of semiconductor chip mounting bodies.

As described above, according to this embodiment, it is possible to prevent the alignment marks 125 from being positionally shifted at the time of mounting of the semiconductor chips 121 and achieve thickness reduction in a semiconductor chip mounting body even if the size of a reinforcing member is reduced.

Note that although in the above explanation, the alignment marks 125 are formed on a reinforcing member, as in the first embodiment, they may be directly formed on the substrate 122, as in the second embodiment.

FIG. 6(A) shows a configuration similar to that in the second embodiment in which a reinforcing member 14 having an opening 14a which is expanded both on the upper and lower edges sides of the semiconductor chips 121, as compared to the opening 11a of the reinforcing member 13 in the third embodiment is used, and the alignment marks 125 are directly formed on the substrate 122 inside a frame-like shape. Since portions where the alignment marks 125 are formed and a portion corresponding to the connection region 123 are seamlessly surrounded and are reinforced by the reinforcing member 14, they have strength enough to keep from deforming due to heat treatment at the time of mounting of the semiconductor chips 121. Accordingly, the alignment marks 125 are prevented from being positionally shifted at the time of heat treatment.

Through holes corresponding to a circuit pattern in the connection region 123 or the like may be formed instead of forming the opening in the reinforcing member.

FIG. 6(B) shows a configuration in which the reinforcing member 14 having a connection region 14b with through holes formed to have the same pattern as that of the connection region 123 is used, and the alignment marks 125 are formed on the reinforcing member 14. Since portions where the alignment marks 125 are formed and a portion corresponding to the connection region 123 of the substrate 122 are reinforced by overlapping with the reinforcing member 14, they have strength enough to keep from deforming due to heat treatment at the time of mounting of the semiconductor chips 121. This prevents the alignment marks 125 from being positionally shifted at the time of heat treatment.

Alternatively, each of the reinforcing members 13 and 14 may be provided on each of surface of the substrate 122, as in the configuration shown in FIG. 3.

Note that although in each of the above-described embodiments, a semiconductor chip mounting substrate is composed of a body formed by stacking a reinforcing member and a substrate, a semiconductor chip mounting substrate according to the present invention may realize a configuration similar to one in which a reinforcing member is stacked by making the thickness of a portion of one substrate different from that of the remaining portion.

FIGS. 7(A) and 7(B) show such a configuration. Portions same as or corresponding to those in FIG. 2 are denoted by the same reference numerals in FIGS. 7(A) and 7(B), and a detailed description thereof will be omitted.

A semiconductor chip mounting substrate 60 is a single substrate which has the same external shape and dimensions as those of the semiconductor chip mounting substrate in the first embodiment and has a projecting portion 60a having the same external shape and dimensions as those of the reinforcing member 11 and a recessed portion 60b having a thickness equal to that of the thin substrate 122. The thickness of the projecting portion 60a is equal to that of the stacked portion of the substrate 122 and reinforcing member 11 of the semiconductor chip mounting substrate 20. Although the projecting portion 60a is made of the same material as that for the substrate 122, since its thickness is sufficiently large, the projecting portion 60a has strength enough to keep from deforming due to heat treatment at the time of mounting of the semiconductor chips 121. Accordingly, the alignment marks 125 formed at the stacked portion are not positionally shifted.

The configuration in FIGS. 7(A) and 7(B) is based on the external shape in the first embodiment. In each of the configurations according to the second and third embodiments, an external shape similar to that in the configuration may be formed by making the thickness of a substrate nonuniform.

Alternatively, the projecting portion 60a may be formed on each principal surface of the substrate on the basis of the configuration in FIG. 3 according to the first embodiment.

Note that in the configuration in FIGS. 7(A) and 7(B), the projecting portion 60a corresponds to a reinforcing region according to the present invention.

Fourth Embodiment

A semiconductor chip mounting body according to a fourth embodiment is characterized by a semiconductor chip mounting substrate on which semiconductor chips are mounted.

Figure 8A:
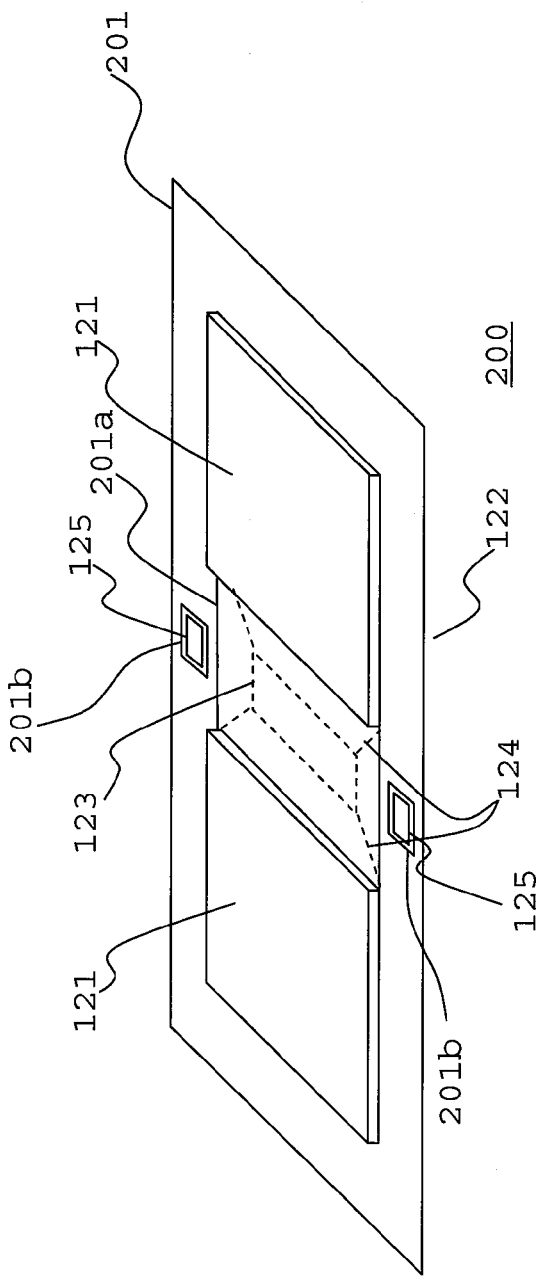
FIG. 8(A) is a perspective view showing a configuration of a semiconductor chip mounting body according to a fourth embodiment of the present invention.
Figure 8B:
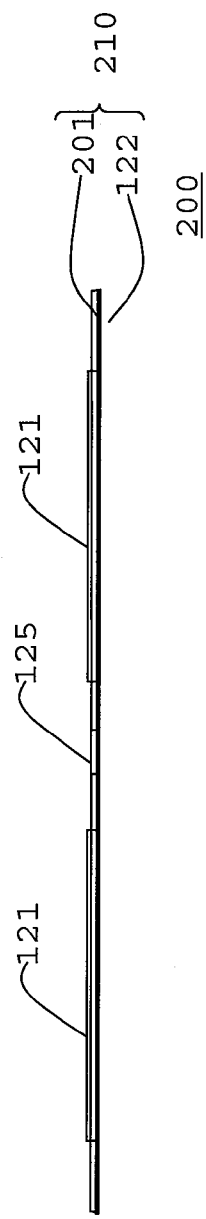
FIG. 8(B) is a side view showing the configuration of the semiconductor chip mounting body according to the fourth embodiment of the present invention.

FIG. 8(A) is a perspective view schematically showing a configuration of the semiconductor chip mounting body according to the fourth embodiment of the present invention, and FIG. 8(B) is a side view thereof. Note that portions same as or corresponding to those in FIGS. 1(A) to 1(C) and other figures are denoted by the same reference numerals.

As shown in FIG. 8(A), a semiconductor chip mounting body 200 of this embodiment has a frame-like reinforcing pattern 201 formed therein. The reinforcing pattern 201 has an external shape similar to that of the reinforcing member 11 in the first embodiment and is provided along the edges of the semiconductor chip mounting body 200, and a connection region 123 and a pair of semiconductor chips 121 are arranged in an opening 201a. A pair of openings 201b which is further formed in the reinforcing pattern 201 so that the opening 201a is arranged between each of the opening 201b. Fiducial marks 125 are respectively arranged in the openings 201b.

The reinforcing pattern 201 is a thin metal film formed on a substrate 122 by etching or plating, like the alignment marks 125. Accordingly, as shown in FIG. 8(B), the reinforcing pattern 201 is stacked on the substrate 122 while keeping to a thickness equal to those of the alignment marks 125 and, together with the substrate 122, constitutes a semiconductor chip mounting substrate 210.

Note that in the above-described configuration, the semiconductor chip mounting body 200 corresponds to a semiconductor chip mounting body according to the present invention, and the semiconductor chip mounting substrate 210 corresponds to a semiconductor chip mounting substrate according to the present invention. Also note that each of mounting regions 21 corresponds to a mounting region according to the present invention, and the connection region 123 corresponds to a connection region according to the present invention. Further note that the substrate 122 corresponds to a substrate according to the present invention, and the reinforcing pattern 201 corresponds to a reinforcing pattern according to the present invention.

The semiconductor chip mounting substrate 210 of this embodiment with the above-described configuration is characterized in that the reinforcing pattern 201 made of the same material as that for the alignment marks 125 is formed on the substrate 122 instead of the reinforcing member in each of the first to third embodiments.

In the semiconductor chip mounting substrate 210, the substrate 122 is reinforced by forming the reinforcing pattern 201. As described above, since the reinforcing pattern 201 is a metal film formed by etching or the like, the substrate 122 reinforced by the reinforcing pattern 201 has strength enough to keep from deforming due to heat treatment at the time of mounting of the semiconductor chips 121. Accordingly, the alignment marks 125 formed at the reinforcing pattern 201 are not positionally shifted.

In this embodiment, the thickness of the reinforcing pattern 201 is equal to those of the alignment marks 125 and thus is smaller than those of the semiconductor chips 121. The thickness of the semiconductor chip mounting body 200 is determined by those of the semiconductor chips 121 and substrate 122 and, accordingly, depends on the thickness of the substrate 122. The reinforcement with the reinforcing pattern 201 allows use of a thin film with a thickness of 10 to 15 μm as the substrate 122.

As described above, according to this embodiment, it is possible to prevent the alignment marks 125 from being positionally shifted at the time of mounting of the semiconductor chips 121 and achieve thickness reduction in a semiconductor chip mounting body.

By setting the reinforcing pattern 201 to be formed to the same thickness as those of the alignment marks 125 using the same material, it is possible to obtain the reinforcing pattern 201 by the same process as that for forming the alignment marks 125. Since an extra process for reinforcement is unnecessary, this configuration is excellent in product efficiency.

Figure 8C:
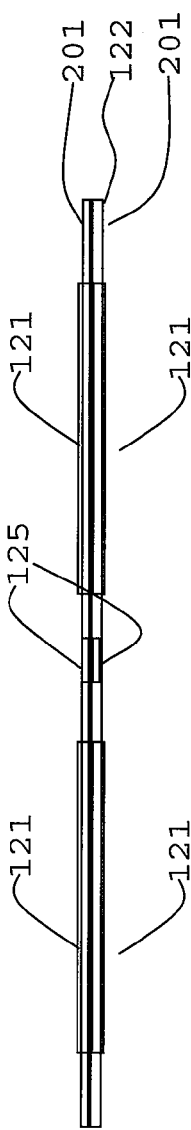
FIG. 8(C) is a side view showing the other configuration of the semiconductor chip mounting body according to the fourth embodiment of the present invention.
Figure 9:
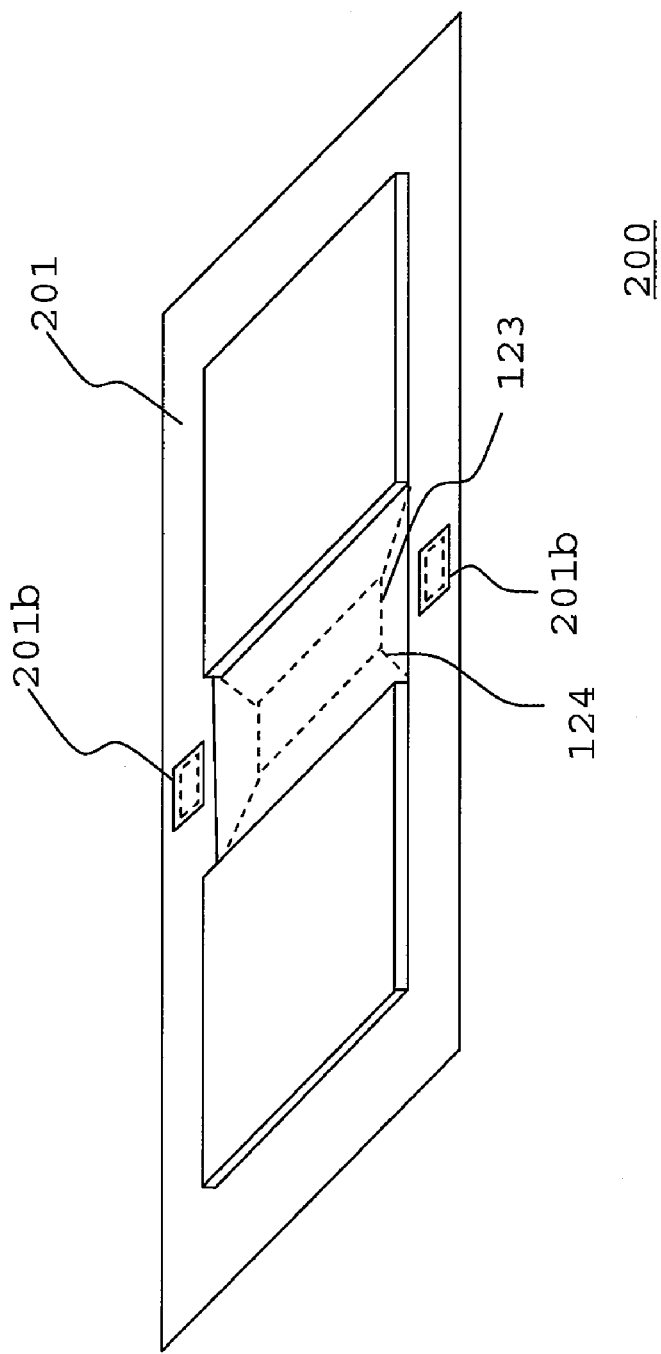
FIG. 9 is a perspective view showing the other configuration of the semiconductor chip mounting body according to the fourth embodiment of the present invention.

Although in the configuration shown in FIGS. 8(A) and 8(B), the semiconductor chip mounting substrate 210 has the reinforcing pattern 201 on one surface of the substrate 122, the reinforcing pattern 201 may be formed on each surface, as shown in FIG. 8(C). Note that the alignment marks 125 only need to be provided on either upper or lower side of the reinforcing patterns 201. FIG. 9 is a perspective view of the configuration shown in FIG. 8(C), as seen from below. Since light passes through a portion having the openings 201b, if the alignment mark 125 is formed on one side (the back side in FIG. 9), the shadow of the alignment mark 125 is seen through the opening 201b on the other side.

If the semiconductor chip mounting body is arranged at the top in a semiconductor stacked module and has no surface electrically connecting with another semiconductor chip mounting body, the reinforcing pattern 201 may be formed to overlap with the connection region 123.

Figure 10:
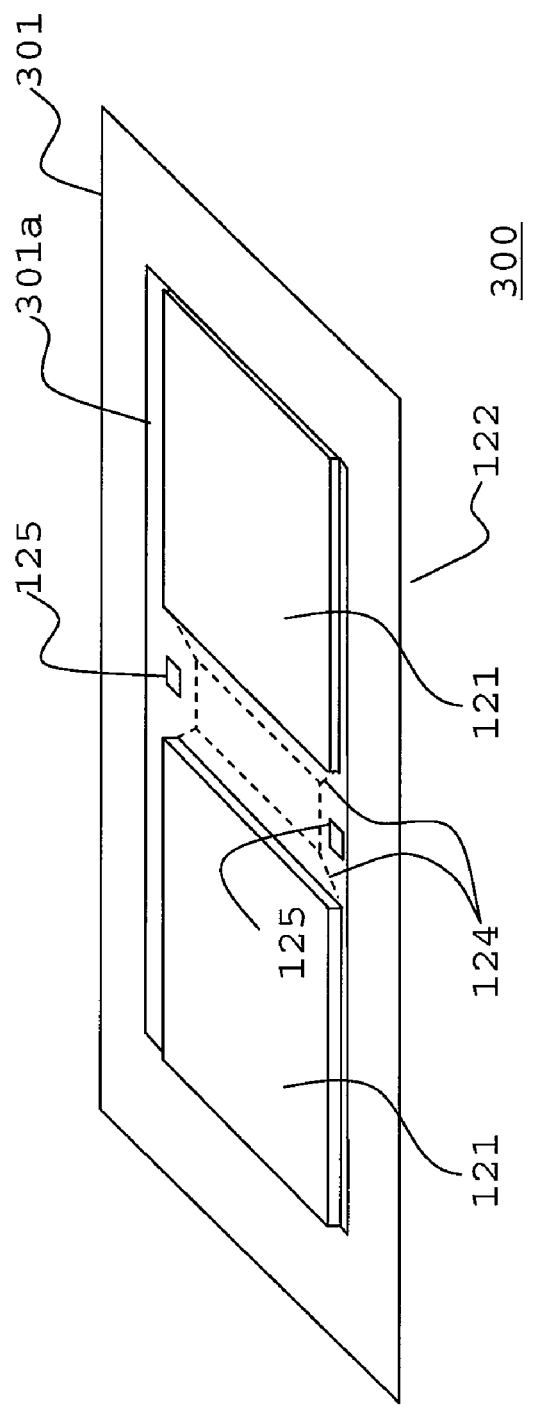
FIG. 10 is a perspective view showing the other configuration of the semiconductor chip mounting body according to the fourth embodiment of the present invention.

Note that although in the above-described configuration, the reinforcing pattern 201 is formed to serve as a frame for the substrate 122, like the reinforcing member 11 in the first embodiment, a reinforcing pattern 301 having an opening 301a with the same external shape as that of the reinforcing member 12 in the second embodiment and the same dimensions as those of the opening 12a may be formed, like a semiconductor chip mounting body 300 shown in FIG. 10. Each of the reinforcing members 13 and 14 described in the third embodiment can be similarly replaced with a reinforcing pattern.

Although in the above explanation, each of the reinforcing patterns 201 and 301 has been described as being formed to surround the connection region 123 on the substrate 122, a reinforcing pattern may be formed in the connection region 123.

Figure 11:
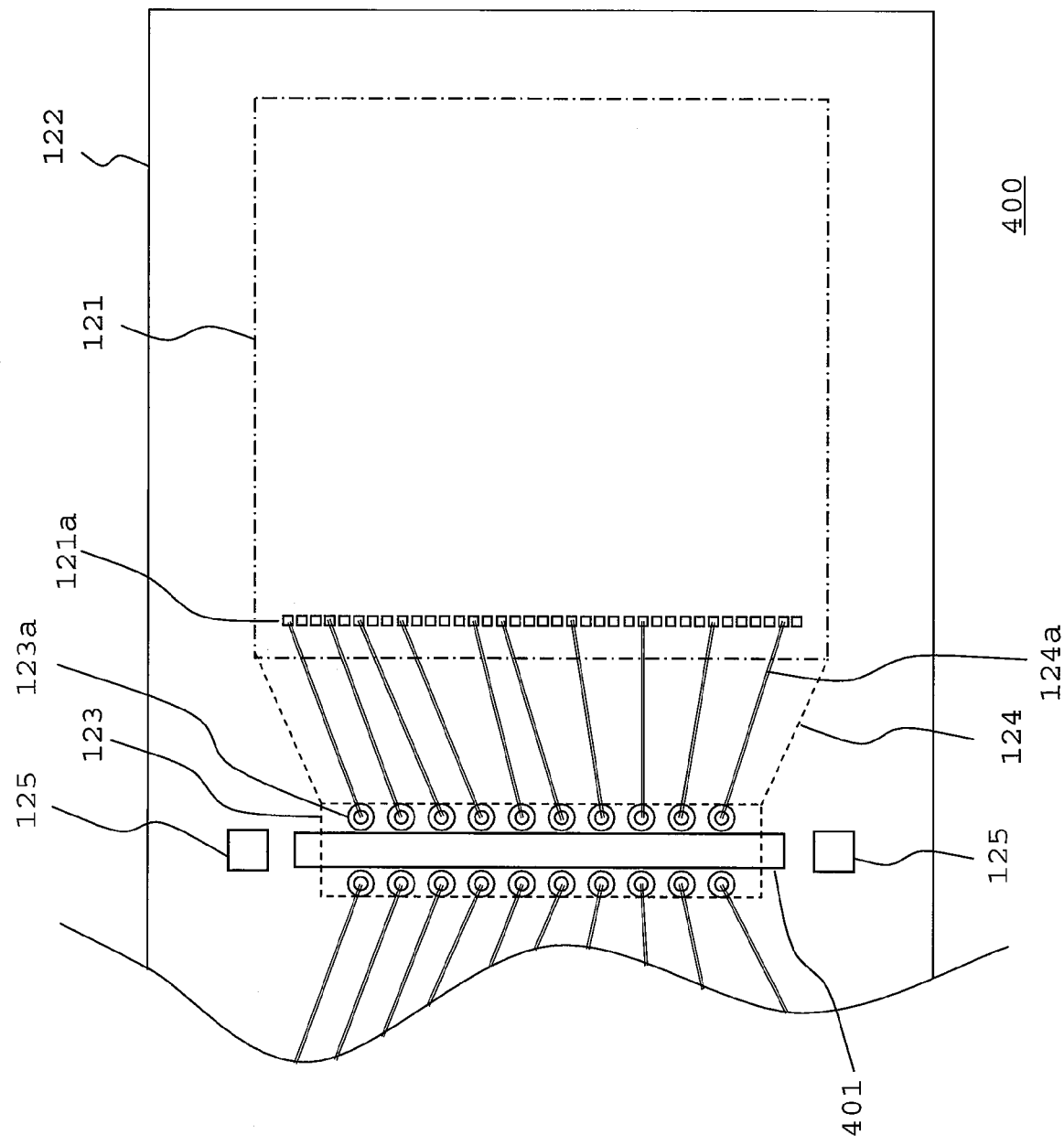
FIG. 11 is a main portion plan view showing the other configuration of the semiconductor chip mounting body according to the fourth embodiment of the present invention.

FIG. 11 is a main portion plan view showing a configuration in which a reinforcing pattern is formed in the connection region 123. In a semiconductor chip mounting body 400 shown in FIG. 11, lands 121a of each semiconductor chip 121 are electrically connected to respective through holes 123a formed in the connection region 123 by wiring patterns 124a constituting a circuit electrode 124. At this time, a reinforcing pattern 401 is formed between a pair of rows of through holes 123a formed corresponding to the pair of semiconductor chips 121 in the connection region 123. Since both ends of the reinforcing pattern 401 are isolated from the through holes 123a, the through holes 123a are not short-circuited to one another. Note that each wiring pattern 124a corresponds to a wiring pattern according to the present invention.

As described above, since the reinforcing pattern 401 is sandwiched between the pair of opposed alignment marks 125, a portion between the alignment marks 125 has strength enough to keep from deforming due to heat treatment at the time of mounting of the semiconductor chips 121. Accordingly, the positions of the alignment marks 125 are not shifted from those at the time of formation.

Note that although the reinforcing pattern 401 is formed to have a length long enough to protrude from upper and lower ends of the connection region 123, it is not limited to specific dimensions as long as the level of reinforcement can be maintained. The reinforcing pattern 401 may have a length short enough to fit in the connection region 123.

Figure 12:
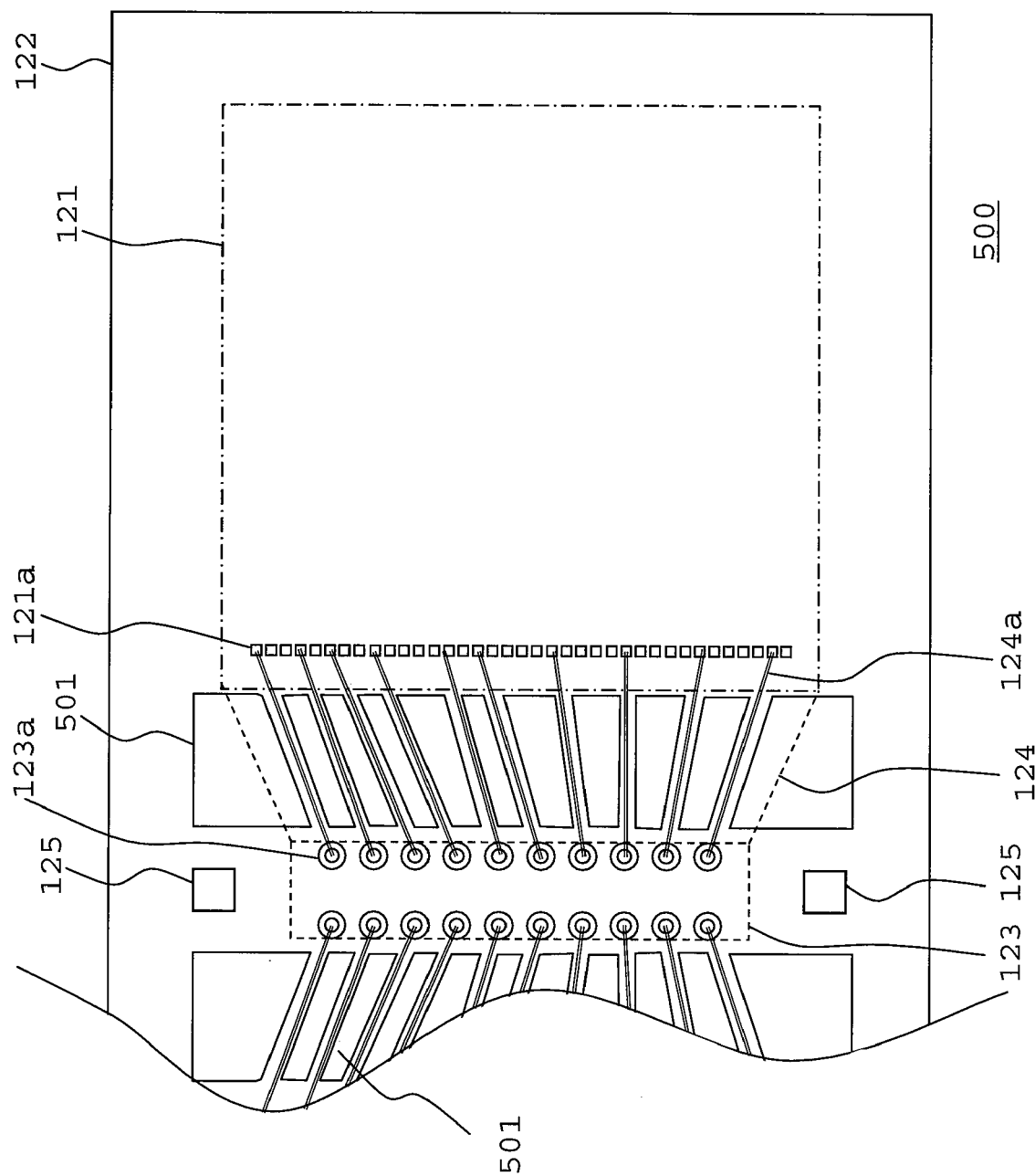
FIG. 12 is a main portion plan view showing the other configuration of the semiconductor chip mounting body according to the fourth embodiment of the present invention.

FIG. 12 is a main portion plan view showing a configuration in which reinforcing patterns are formed between the respective wiring patterns 124a constituting each circuit electrode 124. In a semiconductor chip mounting body 500 shown in FIG. 12, a reinforcing pattern 501 is formed in a space between every two adjacent to each other of the wiring patterns 124a constituting the circuit electrodes 124 or a region adjacent to each of the outermost ones of the wiring patterns 124a. The edges of the reinforcing patterns 501 are isolated from the wiring patterns 124a to prevent the wiring patterns 124a from being short-circuited to each other.

Each reinforcing pattern 501 is adjacent to the wiring pattern(s) 124a constituting a part of the corresponding circuit electrode 124. A portion where each circuit electrode 124 is formed is between the pair of alignment marks 125, and the outermost ones of the reinforcing patterns 501 are protruding from the portion where the circuit electrode 124 is formed and extending to be adjacent to the alignment marks 125. Accordingly, a portion of the substrate 122 between the alignment marks 125 has strength enough to keep from deforming due to heat treatment at the time of mounting of the semiconductor chips 121, and the positions of the alignment marks 125 are not shifted from those at the time of formation.

Note that although the outermost ones of the reinforcing patterns 501 are formed to protrude from the portions where the circuit electrodes 124 are formed in FIG. 12, each reinforcing pattern 501 is not limited to specific dimensions as long as the level of reinforcement can be maintained. The outermost reinforcing patterns 501 may be dimensioned to fit in the circuit electrodes 124.

Fifth Embodiment

A semiconductor chip mounting body according to a fifth embodiment is characterized in that a semiconductor chip mounting substrate reinforcing pattern according to the fourth embodiment is made to double as circuit electrodes 124.

Figure 13:
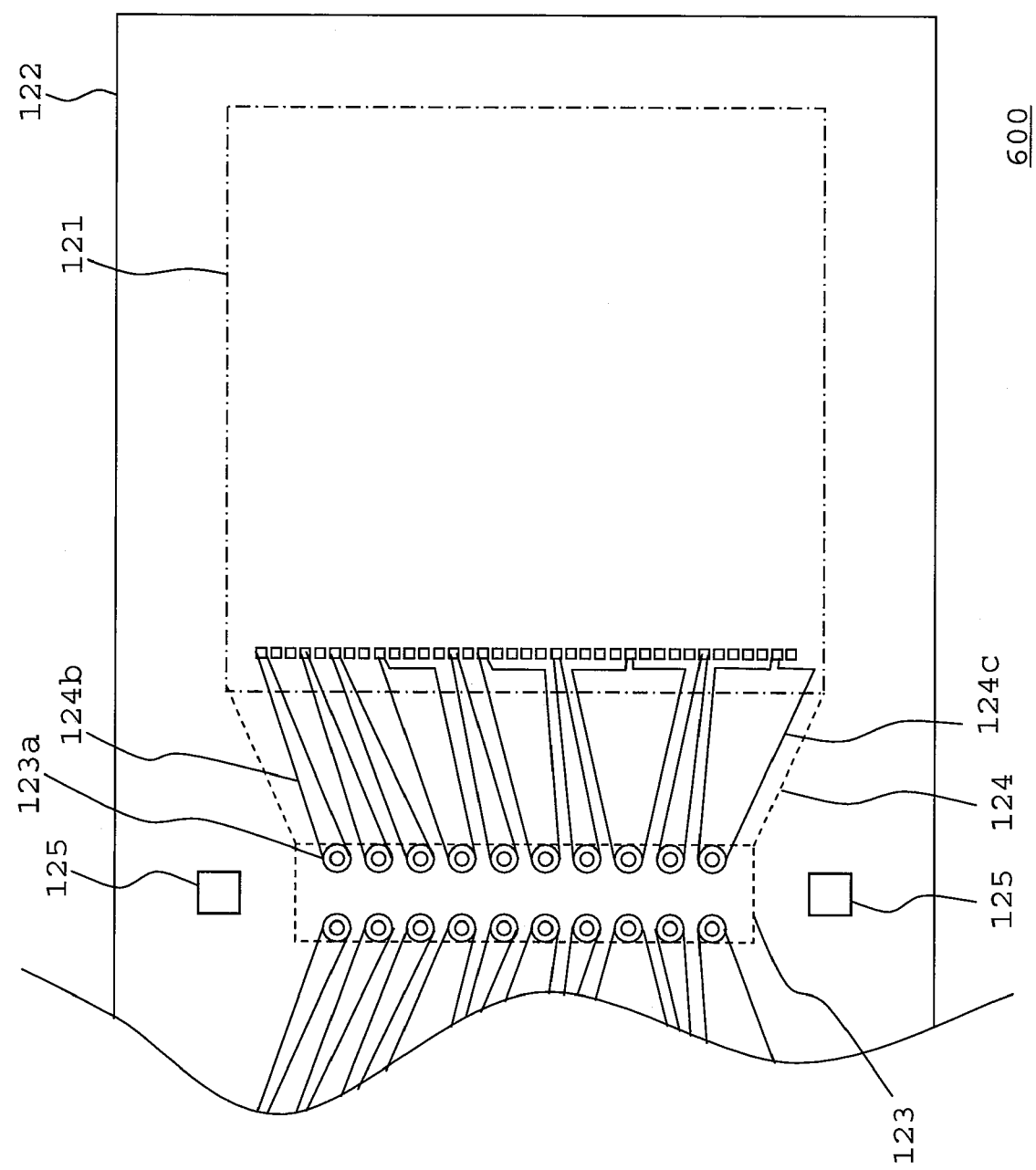
FIG. 13 is a main portion plan view showing a configuration of a semiconductor chip mounting body according to a fifth embodiment of the present invention.

FIG. 13 is a main portion plan view schematically showing a configuration of a semiconductor chip mounting body according to the fifth embodiment of the present invention. Note that portions same as or corresponding to those in FIGS. 1(A) to 1(C) and other figures are denoted by the same reference numerals.

As shown in FIG. 13, in a semiconductor chip mounting body 600 according to this embodiment when semiconductor chips 121 are not mounted on a mounting substrate, wiring patterns constituting each circuit electrode 124, which electrically connect lands 121a of the semiconductor chip 121 and through holes 123a formed in a connection region 123 of a substrate 122, are different in width.

More specifically, the circuit electrode 124 includes a wiring pattern as illustrated by a wiring pattern 124b which narrows from the through hole 123a toward the land 124a and a wiring pattern as illustrated by a wiring pattern 124c which widens from the through hole 123a toward the land 124a.

In the case of a semiconductor chip mounting body used in an SD Memory Card, the diameter of each through hole 123a including an electrode portion is 0.3 mm, and the diameter of a via portion is 0.15 mm. On the other hand, each land 124a of each semiconductor chip 121 is a 0.09-mm square. The through holes 123a and lands 124a are much different in size. The spacing between the through holes 123a is 0.575 mm while the spacing between the lands 124a is 0.6 mm. The through holes 123a and lands 124a are not much different in pitch.

In the prior art, the width of a wiring pattern is set to be uniform independently of the dimensions of such electrode portions. In contrast, the width of the wiring pattern 124b according to this embodiment is made to vary in consideration of the dimensional difference between the land 124a and the through hole 123a. Note that although the actual number of through holes 123a is 29×2 (rows), 58 in total, some of the through holes 123a are omitted in FIG. 13 for illustrative simplicity. The same applies to the configurations described in the fourth embodiment.

Although the wiring pattern 124c is configured to thin immediately in front of the junction with the land 124a to suit the dimensions of the land 124a serving as a connection target, if the wiring pattern 124c can be connected to one(s) of the lands 124a which is (are) not connected to the corresponding through hole(s) 123a in the semiconductor chip 121, it may be also connected to a plurality of lands adjacent to the land 124a serving as the connection target. In this case, the wiring pattern 124c can have a uniformly large width.

With the above-described configuration, in which the width of a wiring pattern varies in each circuit electrode 124, the area covered by wiring patterns which are metal components increases in the substrate 122, and the circuit electrodes 124 reinforce the substrate 122 to a level equivalent to the level to which each reinforcing pattern in the fourth embodiment reinforces the substrate 122.

As in the configuration shown in FIG. 12 according to the fourth embodiment, each circuit electrode 124 is arranged in a portion between a pair of alignment marks 125. Accordingly, the portion of the substrate 122 between the alignment marks 125 has strength enough to keep from deforming due to heat treatment at the time of mounting of the semiconductor chips 121, and the positions of the alignment marks 125 are not shifted from those at the time of formation.

Note that although the wiring patterns 124b and 124c constituting each circuit electrode 124 are formed to be adjacent to the connection region 123 in FIG. 13, they may be formed large enough to extend along sides of the alignment marks 125.

Although the wiring patterns 124b and 124c different in direction of width change are present among the wiring patterns constituting each circuit electrode 124 in FIG. 13, the direction of width change of each wiring pattern may be arbitrarily set depending on the number and layout of wiring patterns between the semiconductor chip 121 and the through holes 123a, which are determined in a design phase. All wiring patterns may be ones which narrow from the through holes 123a toward the lands 121a and vice versa.

As described above, according to this embodiment, it is possible to prevent the alignment marks 125 from being positionally shifted at the time of mounting of the semiconductor chips 121 and achieve thickness reduction in a semiconductor chip mounting body.

Figure 14:
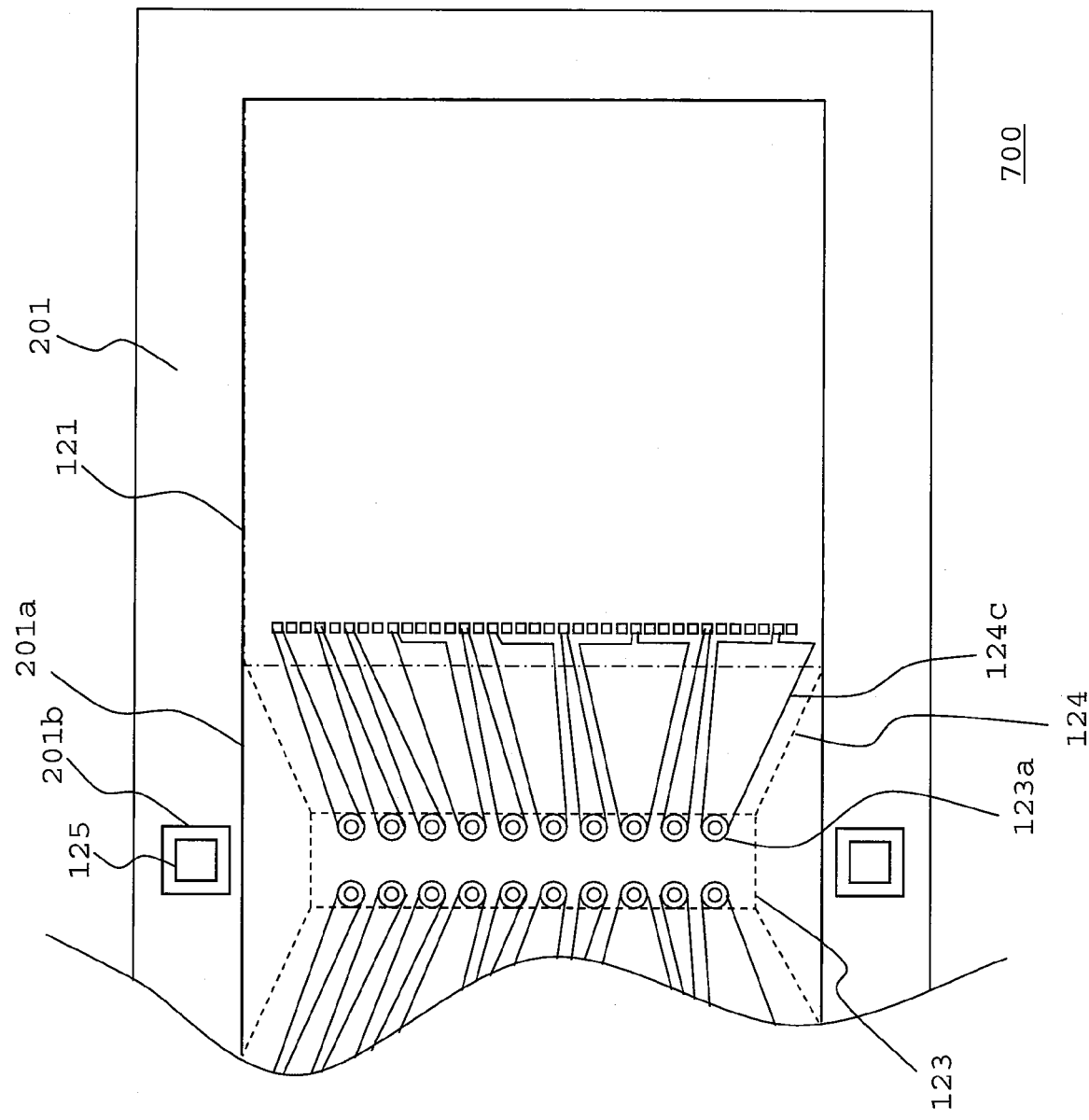
FIG. 14 is a main portion plan view showing the other configuration of the semiconductor chip mounting body according to the fifth embodiment of the present invention.

Note that the configurations in the fourth embodiment and those in the fifth embodiment may be combined, as shown in FIG. 14. The combination has the effect of increasing the strength of a semiconductor chip mounting body itself, in addition to the effect of preventing the semiconductor chip mounting body alignment marks 125 shown in FIG. 14 from being positionally shifted. A reinforcing pattern may be further added to between the pair of rows of through holes 123a.

سixth Embodiment

A sixth embodiment of the present invention relates to a semiconductor stacked module formed by stacking semiconductor chip mounting bodies according to the present invention.

Figure 15:
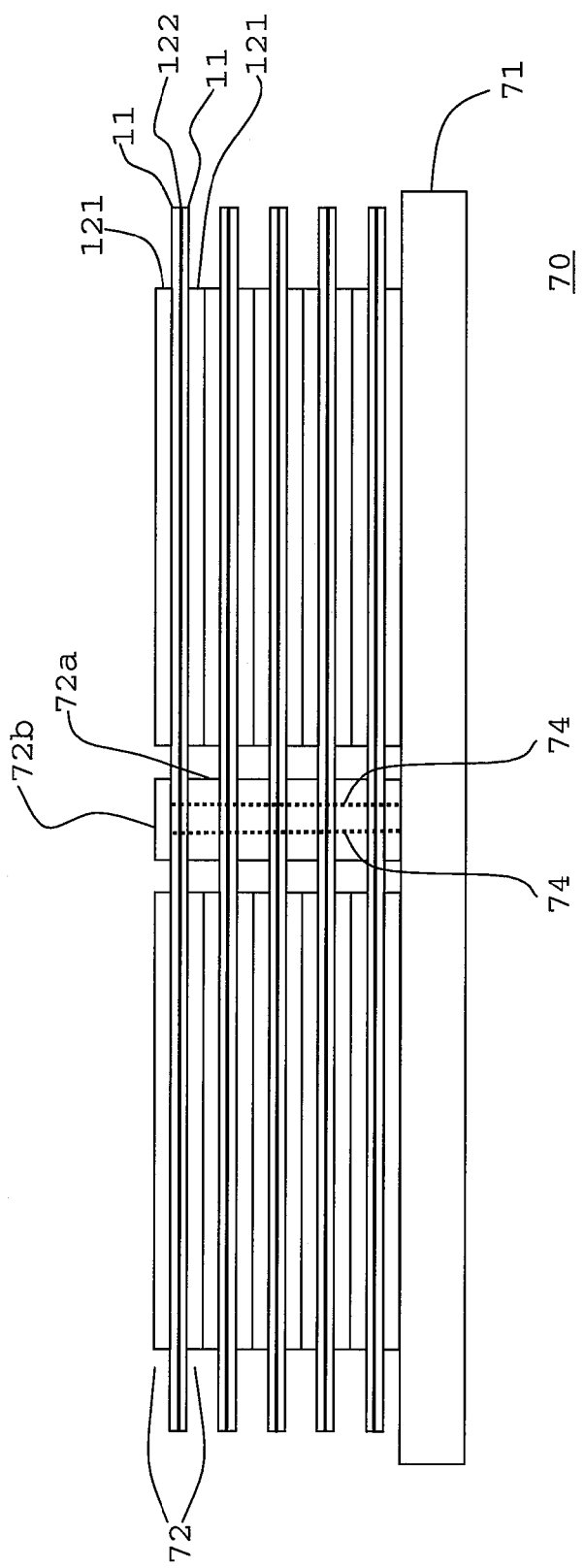
FIG. 15 is a side view showing a configuration of a semiconductor chip stacked module according to a sixth embodiment of the present invention.

FIG. 15 is a side view showing a configuration of the semiconductor stacked module.

As shown in FIG. 15, a semiconductor stacked module 70 is formed by stacking a plurality of semiconductor chip mounting bodies 72 on a mother board 71 for external connection. A spacer 72a or 72b is inserted between adjacent ones of the semiconductor chip mounting bodies 72, depending on the sum of the thicknesses of semiconductor chips 121 between the semiconductor chip mounting bodies 72. The spacers 72a and 72b prevent the semiconductor chip mounting bodies 72 in a stacked state from deforming and maintain good interlayer connection.

Each semiconductor chip mounting body 72 is the same as that shown in FIG. 1(C) according to the first embodiment. A reinforcing member 11 is bonded to each of the two surfaces of a substrate 122, and a total of four semiconductor chips 121 are arranged on the substrate 122, two on each surface.

In the semiconductor chip mounting bodies 72, electrodes or through holes in connection regions 123 are electrically connected to one another through the spacers 72a and 72b, and the semiconductor chip mounting bodies 72 are connected to the mother board 71.

At this time, the planar shape of each of the spacers 72a and 72b corresponds to the shape of a combination of the circuit electrodes 124 and the connection region 123 surrounded by the semiconductor chips 121 and reinforcing member 11 shown in FIG. 1(A). Through holes corresponding to the layout of electrodes or through holes in each connection region 123 are formed in each of the spacers 72a and 72b.

With the above-described configuration, the semiconductor chip mounting bodies 72 at respective layers are interlayer-connected, and one stacked module is finished. The use of the semiconductor chip mounting bodies according to the first embodiment makes it possible to achieve thickness reduction and density increase in a stacked module. Note that semiconductor chip mounting bodies according to the fourth or fifth embodiment may be used instead of ones according to the first embodiment.

Figure 25:
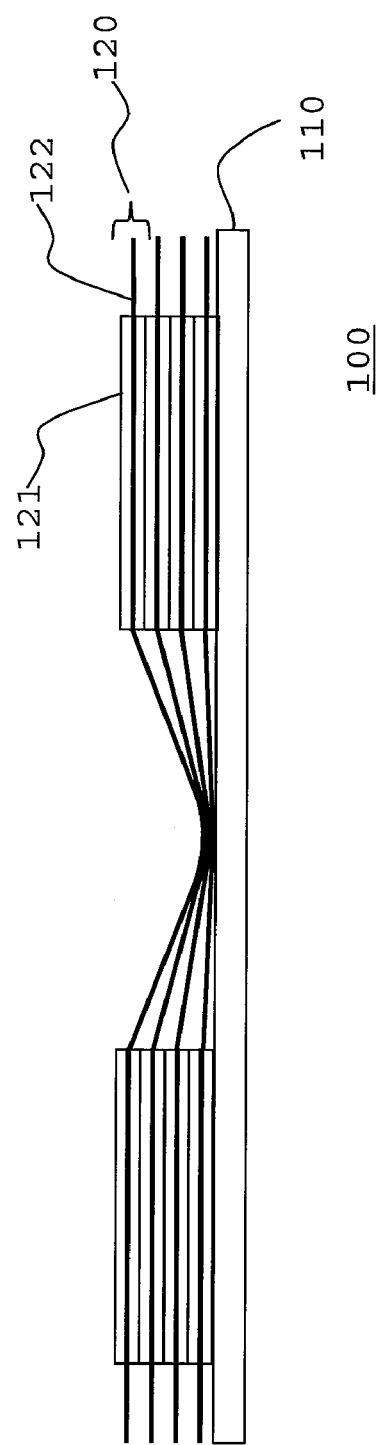
FIG. 25 is a side view showing a configuration of the semiconductor chip stacked module according to the conventional technique.

Note that although in the above-described configuration, the semiconductor chip mounting bodies 72 have been described as being connected to one another through the spacers 72a and 72b, electrical connection may be achieved by laying the semiconductor chip mounting bodies 72 such that the connection regions 123 of the substrates 122 overlap with one another, as in the conventional examples in FIGS. 24(A) and 25.

Seventh Embodiment

A seventh embodiment of the present invention relates to a semiconductor stacked substrate more suitable for formation of a semiconductor stacked module, a semiconductor chip stacked body using the semiconductor stacked substrate, and a semiconductor stacked module using the semiconductor stacked substrate.

Figure 16:
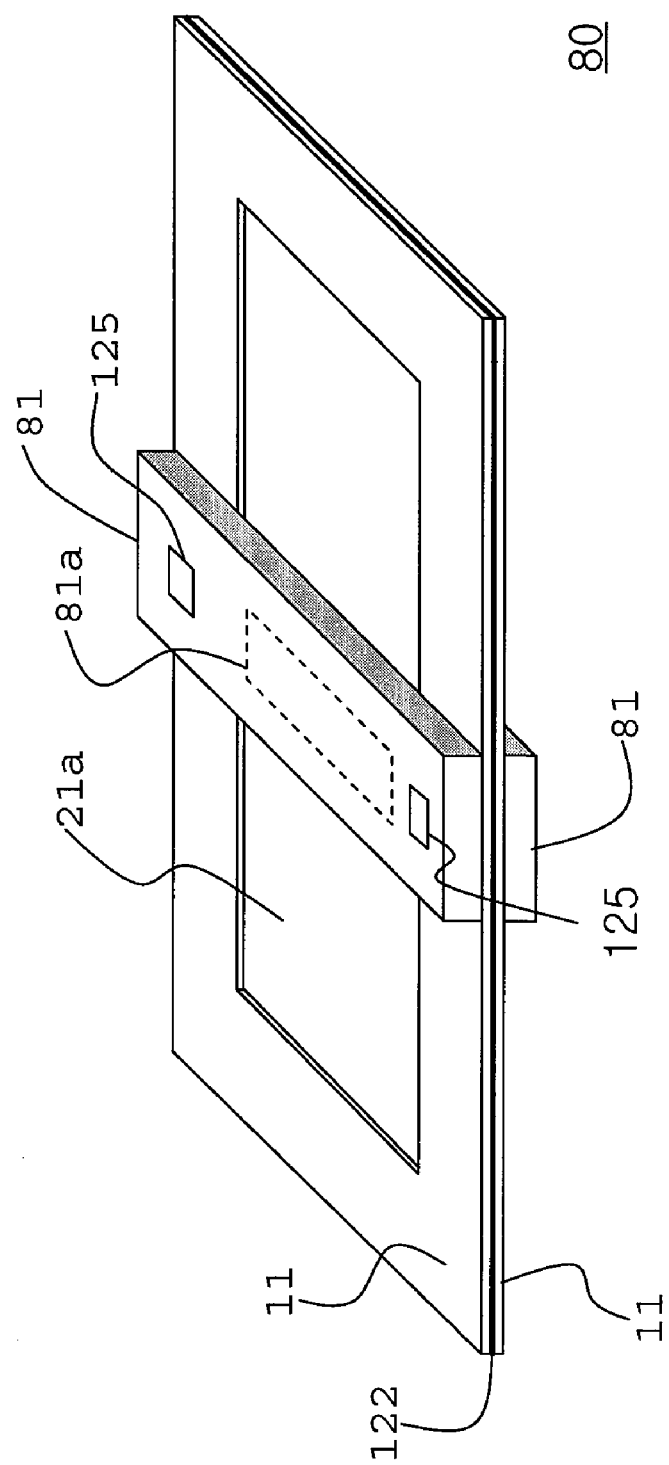
FIG. 16 is a side view showing a configuration of a semiconductor chip mounting substrate according to a seventh embodiment of the present invention.

FIG. 16 is a perspective view schematically showing a configuration of a semiconductor chip mounting substrate according to the seventh embodiment. Note that portions same as or corresponding to those in FIG. 1(C) are denoted by the same reference numerals.

As shown in FIG. 16, a semiconductor chip mounting substrate 80 of this embodiment has a configuration in which a reinforcing member 81 is further provided on each of frame-like reinforcing members 11.

Each reinforcing member 81 is provided between mounting regions 21 and has a connection region 81a corresponding to a connection region 123. Through holes corresponding to the layout of electrodes or through holes in the connection region 123 are formed in the connection region 81a. The sum of the thickness of each reinforcing member 81 and that of the corresponding reinforcing member 11 is designed to be equal to the thicknesses of semiconductor chips 121. The configurations and dimensions of other portions are the same as those in the first embodiment.

The semiconductor chip mounting substrate 80 of this embodiment with the above-described configuration includes the reinforcing members 81, each of which is formed to overlap with the connection region 123. This makes it possible to make the thickness of a portion to be interlayer-connected as a semiconductor chip mounting body 72 equal to that of each semiconductor chip 121.

Figure 17:
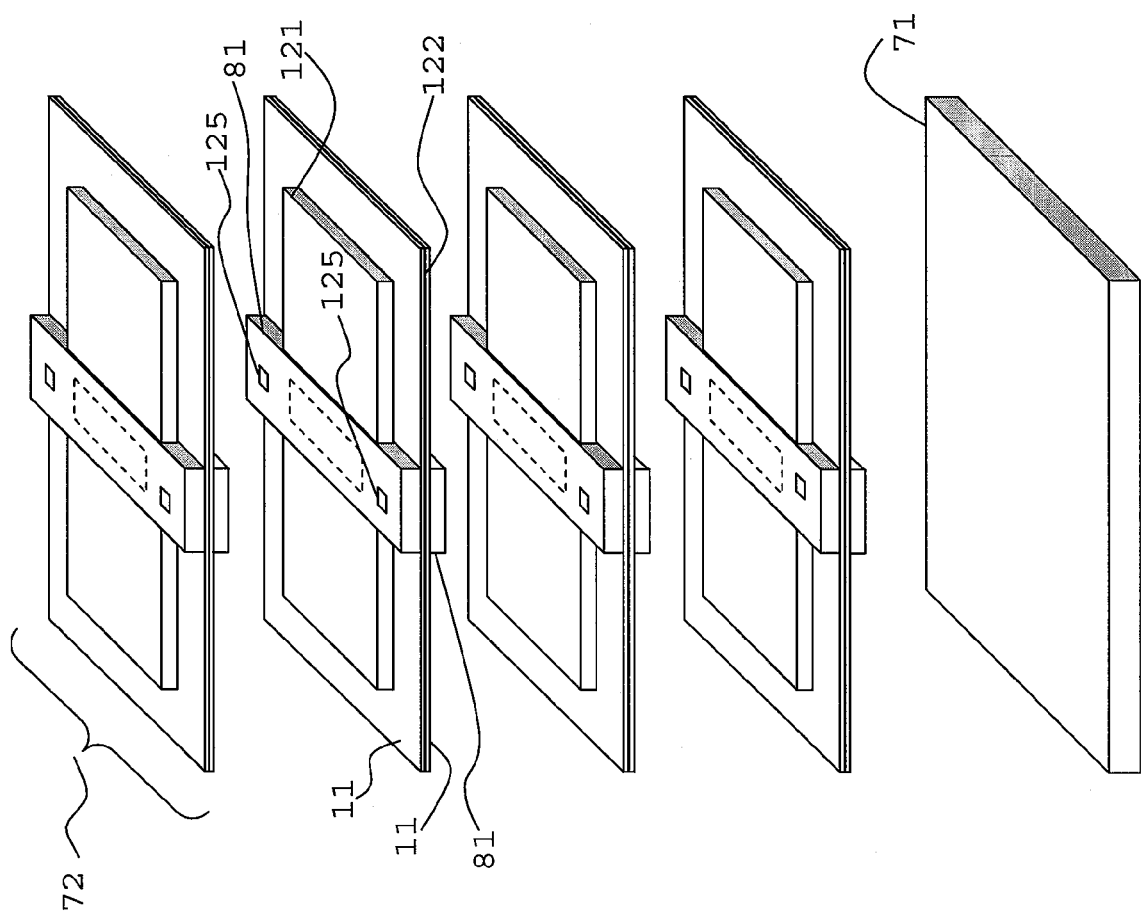
FIG. 17 is an exploded perspective view showing a configuration of a semiconductor chip stacked module according to the seventh embodiment of the present invention.

For this reason, it is possible to obtain a semiconductor stacked module as shown in the exploded perspective view in FIG. 17. In the configuration in FIG. 17, the semiconductor chip mounting bodies 72 are stacked by bonding principal surfaces of the semiconductor chips 121 and those of the reinforcing members 81 together, and the connection regions 123 are electrically connected to one another through the reinforcing members 81.

As described above, arrangement of the reinforcing members 81 makes it possible to prevent substrate deformation at the time of stacking and ensure good electrical connection with a simpler configuration without spacers as described in the fourth embodiment.

Note that although in the above-described configuration, the reinforcing member 11 and the corresponding reinforcing member 81 are separate members, they may be formed to be integral with each other.

Although the configuration shown in FIG. 16 is based on a semiconductor chip mounting substrate and semiconductor chip mounting body according to the first embodiment, this embodiment using a reinforcing member in place of a spacer may be realized on the basis of any other of the embodiments.

Figure 18:
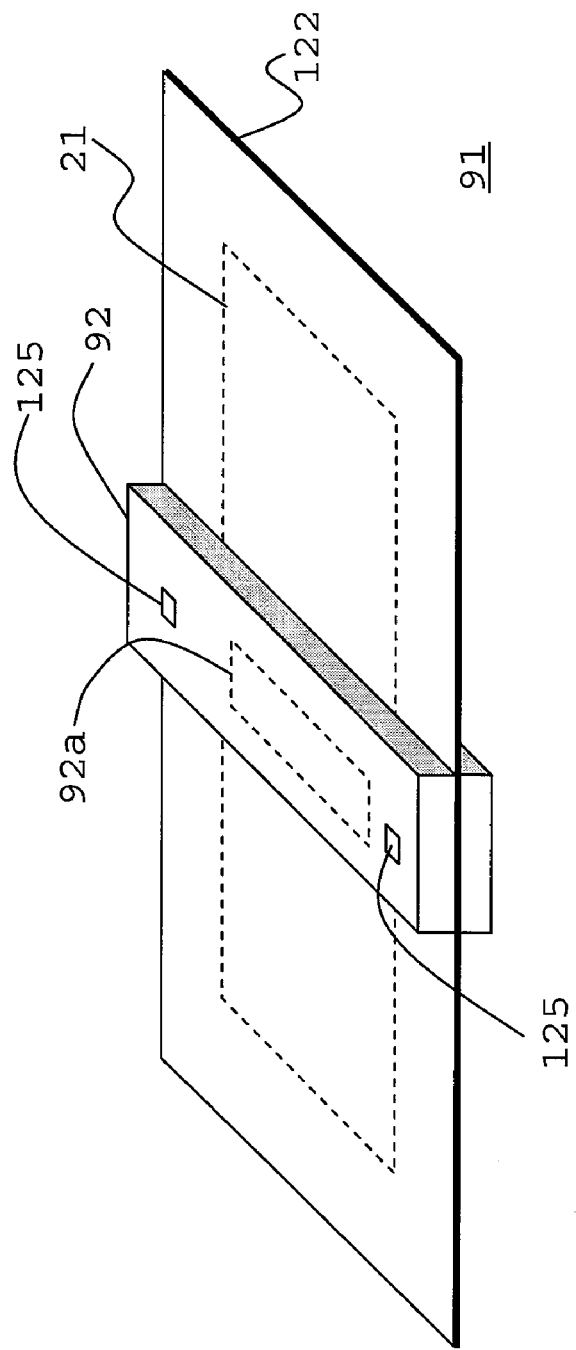
FIG. 18 is a perspective view showing the other configuration of the semiconductor chip mounting substrate according to the seventh embodiment of the present invention.

FIG. 18 shows, as an example, a semiconductor chip mounting substrate 91 obtained by replacing the semiconductor chip mounting substrate reinforcing member 13 according to the third embodiment with a reinforcing member 92 with the same thickness as those of the semiconductor chips 121. The configuration of a connection region 92a is the same as that of the connection region 81a. The dimensions of portions other than the thickness of the reinforcing member 92 are the same as those in the configuration in the third embodiment.

Figure 19:
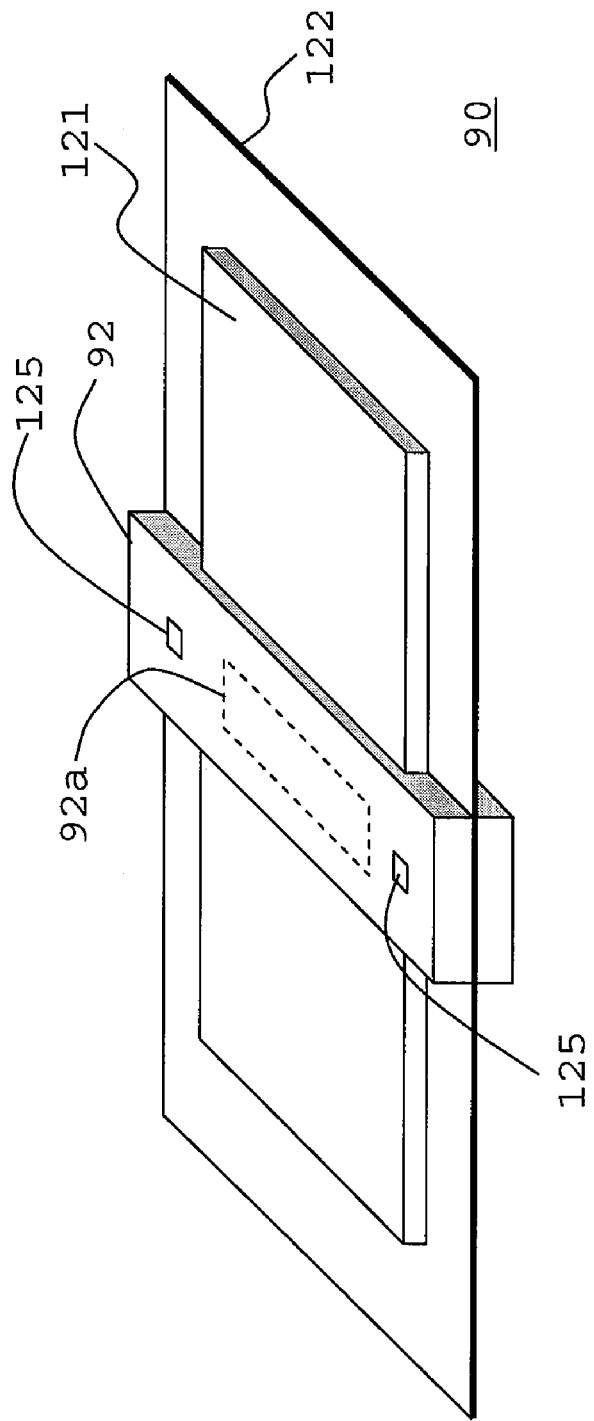
FIG. 19 is a perspective view showing the other configuration of a semiconductor chip mounting body according to the seventh embodiment of the present invention.

The semiconductor chip mounting body 90 shown in FIG. 19 can be obtained by mounting the semiconductor chips 121 on the semiconductor chip mounting substrate 91. Since the thickness of the reinforcing member 92 and those of the semiconductor chips 121 are equal, it is possible to prevent substrate deformation at the time of stacking and ensure good electrical connection.

Although in the above explanation, semiconductor chips have been described as being mounted on each surface of a semiconductor chip mounting body, semiconductor chips may be mounted on only one of the two surfaces. At this time, a semiconductor chip mounting body having a surface which does not electrically connect with another semiconductor chip mounting body at the time of stacking may be formed such that a reinforcing member or reinforcing pattern overlaps with the connection region 123. In a semiconductor chip stacked module according to the present invention, not all of semiconductor chip mounting bodies need to be ones according to the present invention. Only some of the semiconductor chip mounting bodies may be ones according to the present invention.

Although a reinforcing member has been described as being made of a resin material such as polyimide which is the same as that for the substrate 122, a metal such as copper foil may be used. At this time, the reinforcing member can be formed on or in the substrate 122 as a separate electrode. The electrode may be formed simultaneously with formation of the circuit electrodes 124.

Figure 20:
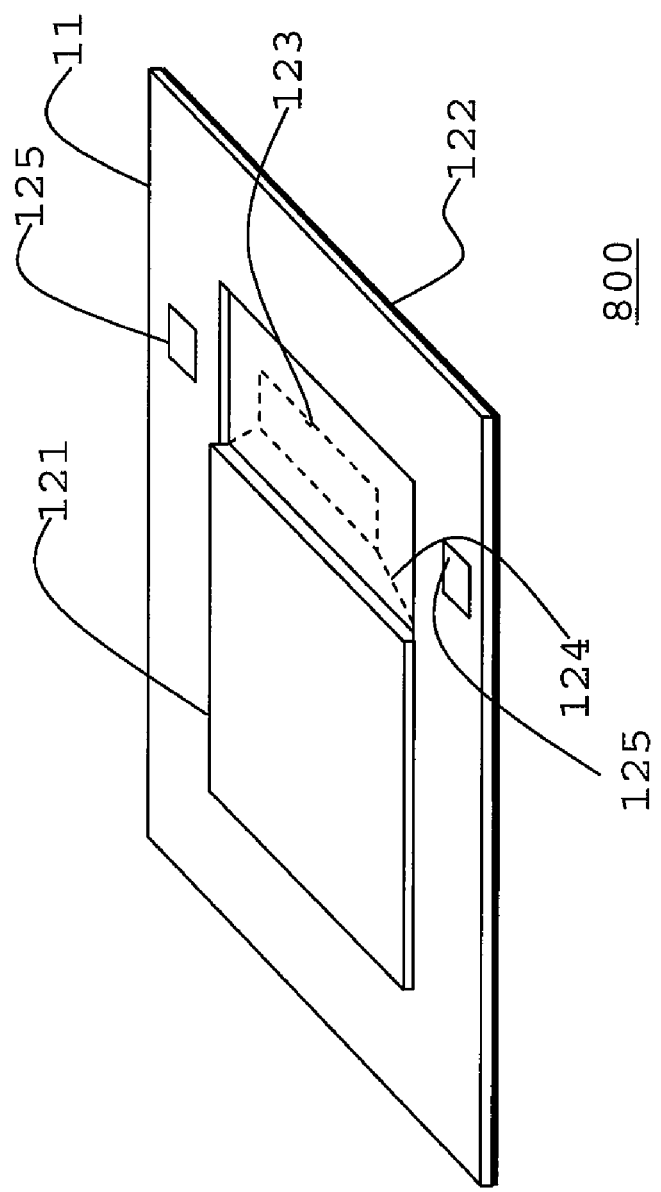
FIG. 20 is a perspective view showing another configuration of the semiconductor chip mounting bodies according to the embodiments of the present invention.

Although in each of the above-described embodiments, a semiconductor chip mounting body is configured such that the pair of semiconductor chips 121 are arranged with the connection region 123 there between, the present invention is not limited to this. The present invention can also be applied to, e.g., a configuration, like a semiconductor chip mounting body 800 shown in FIG. 20, in which one semiconductor chip 121 is mounted on a substrate and which includes the connection region 123 having electrodes, through holes, or the like for interlayer connection. Note that although the configuration shown in FIG. 20 is based on the first embodiment, a configuration based on any other of the embodiments may be adopted.

Figure 21:
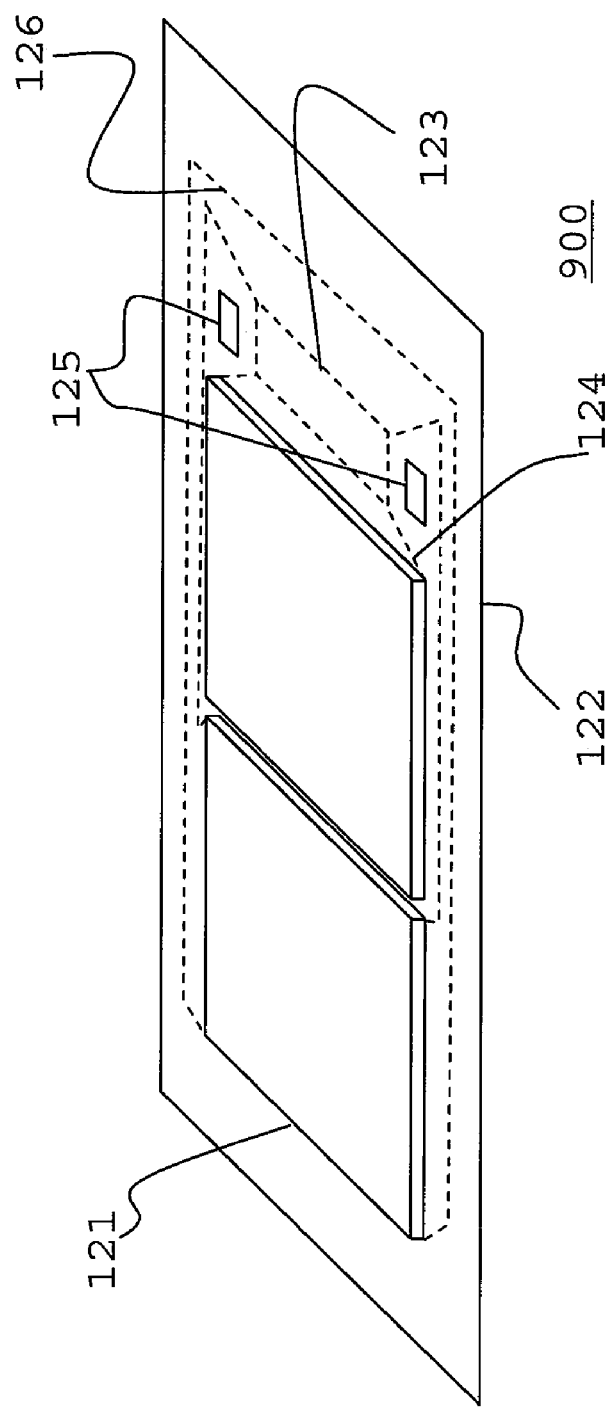
FIG. 21 is a perspective view showing still another configuration of the semiconductor chip mounting bodies according to the embodiments of the present invention.

The present invention can be further applied to a configuration, like a semiconductor chip mounting body 900 shown in FIG. 21, in which two semiconductor chips 121 are arranged on a substrate adjacent to each other, and the connection region 123 is adjacent only to one of the semiconductor chips 121. In this case, the other semiconductor chip 121, which is not adjacent to the connection region 123, and the connection region 123 are electrically connected to each other by a circuit electrode 126 which is routed across the one semiconductor chip 121. The circuit electrode 126 is connected to the connection region 123 through portions outside the pair of alignment marks 125 (along edges of the substrate 122).

At this time, since a wiring pattern of the circuit electrode 126 functions as a reinforcing pattern for increasing the strength of a portion where the pattern is formed, as in the fifth embodiment, the same advantages as those in the other embodiments can be obtained.

Figure 22:
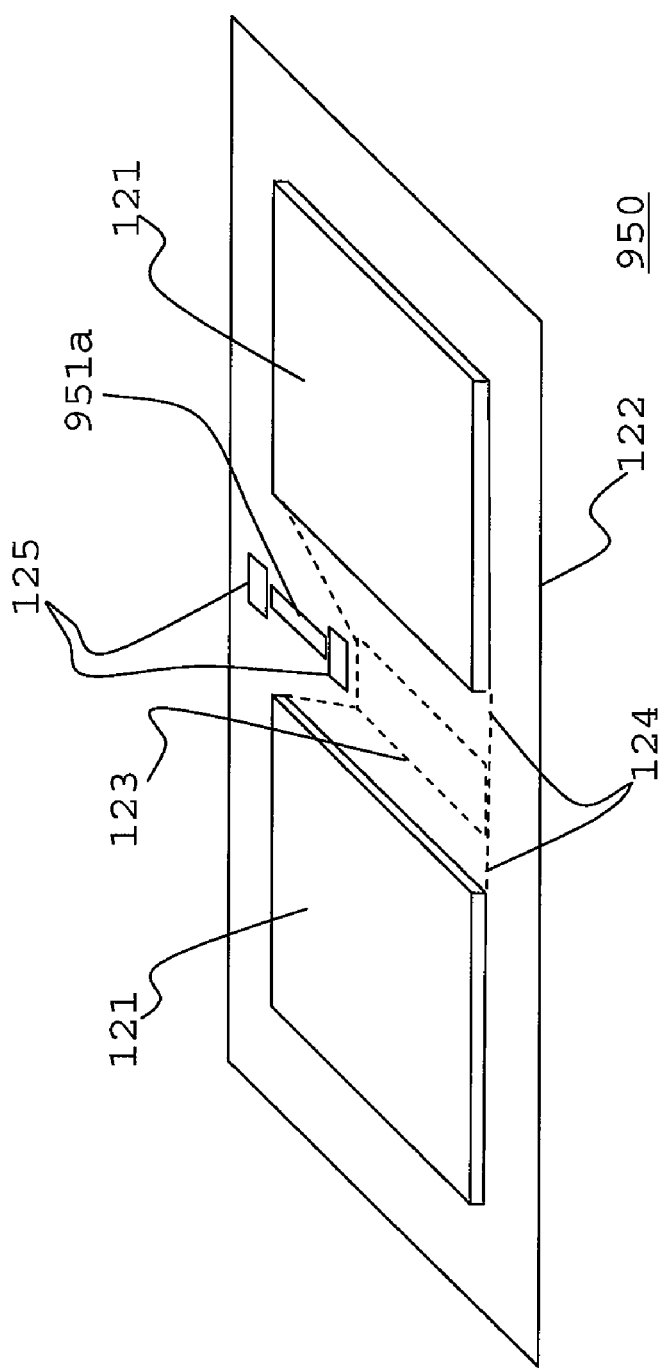
FIG. 22 is a perspective view showing still another configuration of the semiconductor chip mounting bodies according to the embodiments of the present invention.

Like a semiconductor chip mounting body 950 shown in FIG. 22, the connection region 123 may be off-center. In this case, since the pair of alignment marks 125 can be arranged without arranging the connection region 123 between them, a reinforcing pattern 951a similar to those in the fourth embodiment can be formed between the alignment marks 125, and the same advantages as those in the configuration shown in FIG. 11 can be obtained.

Figure 23:
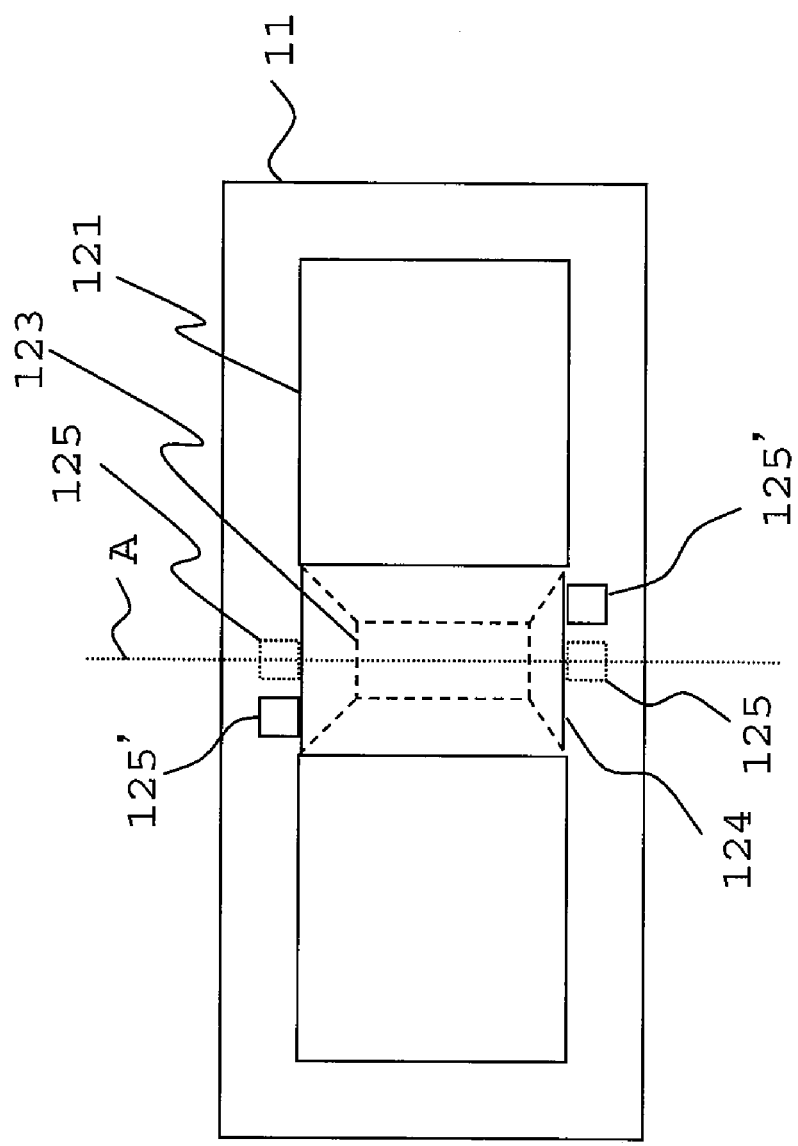
FIG. 23 is a plan view showing still another configuration of the semiconductor chip mounting bodies according to the embodiments of the present invention.

Note that although in each of the above-described embodiments, the alignment marks 125 are configured to face each other with the connection region 123 there between, their positions are not limited to this. Like a pair of alignment marks 125' shown in FIG. 23, alignment marks may be arranged at positions shifted from a center line A passing through the center of the connection region 123 to the right and left sides, respectively.

This configuration makes it possible to two-dimensionally capture a positional shift of a alignment mark.

Although in each of the above-described embodiments, the shapes of the alignment marks 125 are rectangular, they may have an arbitrary shape such as a circle or ellipse.

In other words, the constitution of the present invention can be applied to any semiconductor chip mounting body that has a connection region formed for interlayer connection and needs a alignment mark for alignment regardless of its specific configuration, i.e., the number and shape of semiconductor chips to be mounted, the positions, sizes, and layout of a connection region and circuit electrode, and the shape of a alignment mark.

The present invention has the advantage of a semiconductor chip mounting substrate or the like capable of ensuring alignment at the time of stacking while thinning a semiconductor chip mounting body and can be effectively applied to, e.g., a semiconductor stacked module such as an SD Memory Card or PC Card.

What is claimed is:

1. A semiconductor chip mounting substrate comprising:
a substrate on which a mounting region for mounting a semiconductor chip and a connection region for interlayer connection of the semiconductor chip are formed; and
a plurality of alignment marks for alignment at the time of stacking which are provided around or in the connection region on the substrate,
wherein a reinforcing region for reinforcing a portion between the plurality of alignment marks is formed on the substrate.

2. The semiconductor chip mounting substrate according to claim 1, wherein at least a pair of ones of the plurality of alignment marks are provided in such a way as sandwich to have the connection region between the pair of alignment marks.

3. The semiconductor chip mounting substrate according to claim 1, wherein the alignment marks are arranged in the reinforcing region.

4. The semiconductor chip mounting substrate according to claim 3, wherein the reinforcing region is formed to overlap with the connection region.

5. The semiconductor chip mounting substrate according to claim 1, wherein
the mounting region and connection region are adjacent to each other and
the reinforcing region is formed to surround the mounting region and connection region.

6. The semiconductor chip mounting substrate according to claim 1, wherein
the mounting region and connection region are adjacent to each other, and
the reinforcing region is formed to surround only the connection region.

7. The semiconductor chip mounting substrate according to claim 1, wherein the mounting region comprises a pair of regions which sandwich the connection region between the pair of regions.

8. The semiconductor chip mounting substrate according to claim 1, wherein a thickness of the reinforcing region of the substrate is larger than a thickness of the remaining region of the substrate.

9. The semiconductor chip mounting substrate according to claim 8, wherein the substrate is a body formed by stacking a base material with a predetermined shape which includes the mounting region, connection region, and reinforcing region and a reinforcing member with a shape corresponding to the reinforcing region.

10. The semiconductor chip mounting substrate according to claim 8, wherein the substrate is composed of a single member in which a thickness of a portion corresponding to the reinforcing region is larger than a thickness of the remaining portion.

11. The semiconductor chip mounting substrate according to claim 8, wherein the thickness of the reinforcing region is smaller than a thickness of the semiconductor chip.

12. The semiconductor chip mounting substrate according to claim 8, wherein the thickness of the reinforcing region is equal to a thickness of the semiconductor chip.

13. The semiconductor chip mounting substrate according to claim 1, wherein a thickness of the reinforcing region of the substrate is equal to thicknesses of portions where the alignment marks are provided.

14. The semiconductor chip mounting substrate according to claim 13, further comprising
a reinforcing pattern provided in the reinforcing region on the substrate which has a thickness equal to thicknesses of the alignment marks.

15. The semiconductor chip mounting substrate according to claim 14, wherein the reinforcing pattern is made of a same material as a material for the alignment marks.

16. The semiconductor chip mounting substrate according to claim 14, wherein the reinforcing pattern doubles as a wiring pattern which electrically connects the mounting region and connection region.

17. A semiconductor chip mounting body comprising:
a semiconductor chip mounting substrate according to claim 1; and
a semiconductor chip mounted in the mounting region of the mounting substrate.

18. A semiconductor chip stacked module,
wherein a plurality of semiconductor chip mounting bodies according to claim 17 are stacked by alignment based on the alignment marks, and
the semiconductor chip mounting bodies are electrically connected to each other at the connection regions.

19. The semiconductor chip stacked module according to claim 18, wherein the plurality of semiconductor chip mounting bodies are stacked while every adjacent reinforcing regions of the semiconductor chip mounting substrates are in contact with each other, and every adjacent surfaces of the semiconductor chips are in contact with each other.

20. A semiconductor chip mounting substrate manufacturing method comprising:
a step of bonding, to a base material with a predetermined shape on which a mounting region for mounting a semiconductor chip and a connection region for interlayer connection of the semiconductor chip are formed, a reinforcing member which is either formed around the connection region or formed to overlap with the connection region, wherein
a plurality of alignment marks for alignment at the time of stacking are provided in one of the reinforcing member and the connection region.

21. A semiconductor chip mounting substrate manufacturing method comprising:
a step of providing, on a base material with a predetermined shape on which a mounting region for mounting a semiconductor chip and a connection region for interlayer connection of the semiconductor chip are formed, a plurality of alignment marks for alignment at the time of stacking; and
a step of forming a reinforcing pattern with a thickness equal to thicknesses of the plurality of alignment marks for reinforcing a portion between the alignment marks, which is to be performed at the time before or after or at the same time, as the step of providing the alignment marks.

* * * * *